United States Patent
Takeda et al.

(10) Patent No.: US 8,774,288 B2
(45) Date of Patent: Jul. 8, 2014

(54) RECEIVER AND SEMICONDUCTOR INTEGRATED CIRCUIT HAVING THE SAME

(71) Applicant: Renesas Electronics Corporation, Kawasaki (JP)

(72) Inventors: Koichi Takeda, Kanagawa (JP); Shunichi Kaeriyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/784,262

(22) Filed: Mar. 4, 2013

(65) Prior Publication Data
US 2013/0259144 A1 Oct. 3, 2013

(30) Foreign Application Priority Data
Mar. 30, 2012 (JP) .................................. 2012-082323

(51) Int. Cl.
*H04L 25/00* (2006.01)
*H04B 3/00* (2006.01)

(52) U.S. Cl.
USPC ............ 375/258; 375/316; 375/324; 375/340

(58) Field of Classification Search
CPC .................. H04B 2203/5483; H04L 25/0266; H04L 27/22; H04L 27/2647; H03K 9/04; H03K 11/00
USPC ................... 375/258, 316, 324, 340
See application file for complete search history.

(56) References Cited

U.S. PATENT DOCUMENTS

| | | | | |
|---|---|---|---|---|
| 5,754,250 | A | * | 5/1998 | Cooper .......................... 348/525 |
| 8,582,669 | B2 | * | 11/2013 | Chen, Jr. ....................... 375/258 |
| 8,634,480 | B2 | * | 1/2014 | Nuebling et al. ............. 375/258 |
| 2003/0042571 | A1 | | 3/2003 | Chen et al. |
| 2012/0007710 | A1 | * | 1/2012 | Tucci et al. .................... 338/202 |

OTHER PUBLICATIONS

Extended European Search Report issued in Application No. 13156891.7-1855 dated Jul. 24, 2013.

* cited by examiner

*Primary Examiner* — Ted Wang
(74) *Attorney, Agent, or Firm* — McDermott Will & Emery LLP

(57) ABSTRACT

A receiver includes a positive pulse determination circuit and a negative pulse determination circuit. The positive pulse determination circuit outputs a first L-level between when a pulse signal having a negative amplitude is detected and when neither a pulse signal having a positive amplitude nor a pulse signal having a negative amplitude is detected; otherwise a first H-level if a pulse signal having a positive amplitude is detected during another period. The negative pulse determination circuit outputs a second L-level between when a pulse signal having a positive amplitude is detected and when neither a pulse signal having a positive amplitude nor a pulse signal having a negative amplitude is detected; otherwise a second H-level is output if a pulse signal having a negative amplitude is detected during the other period.

9 Claims, 28 Drawing Sheets

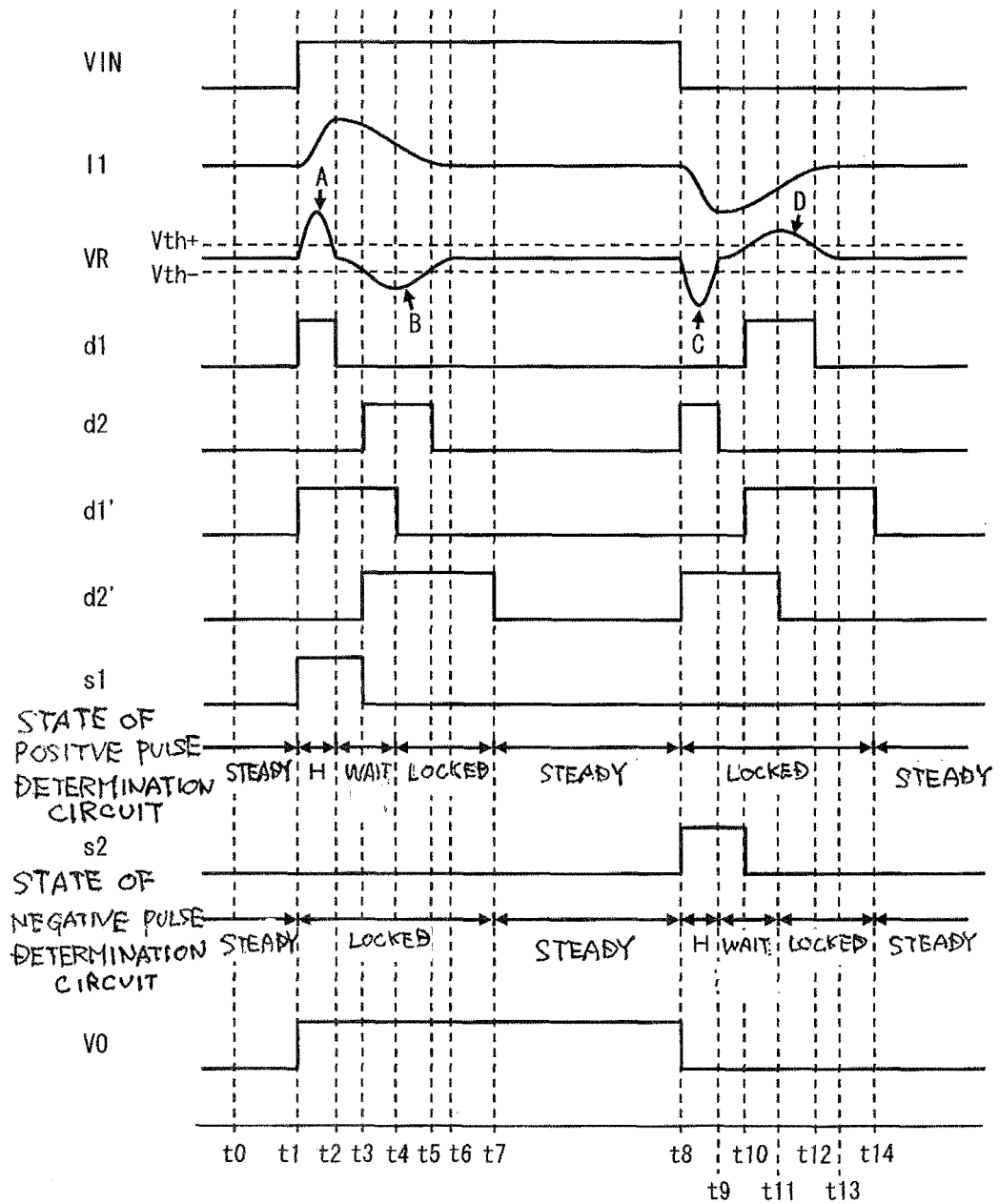

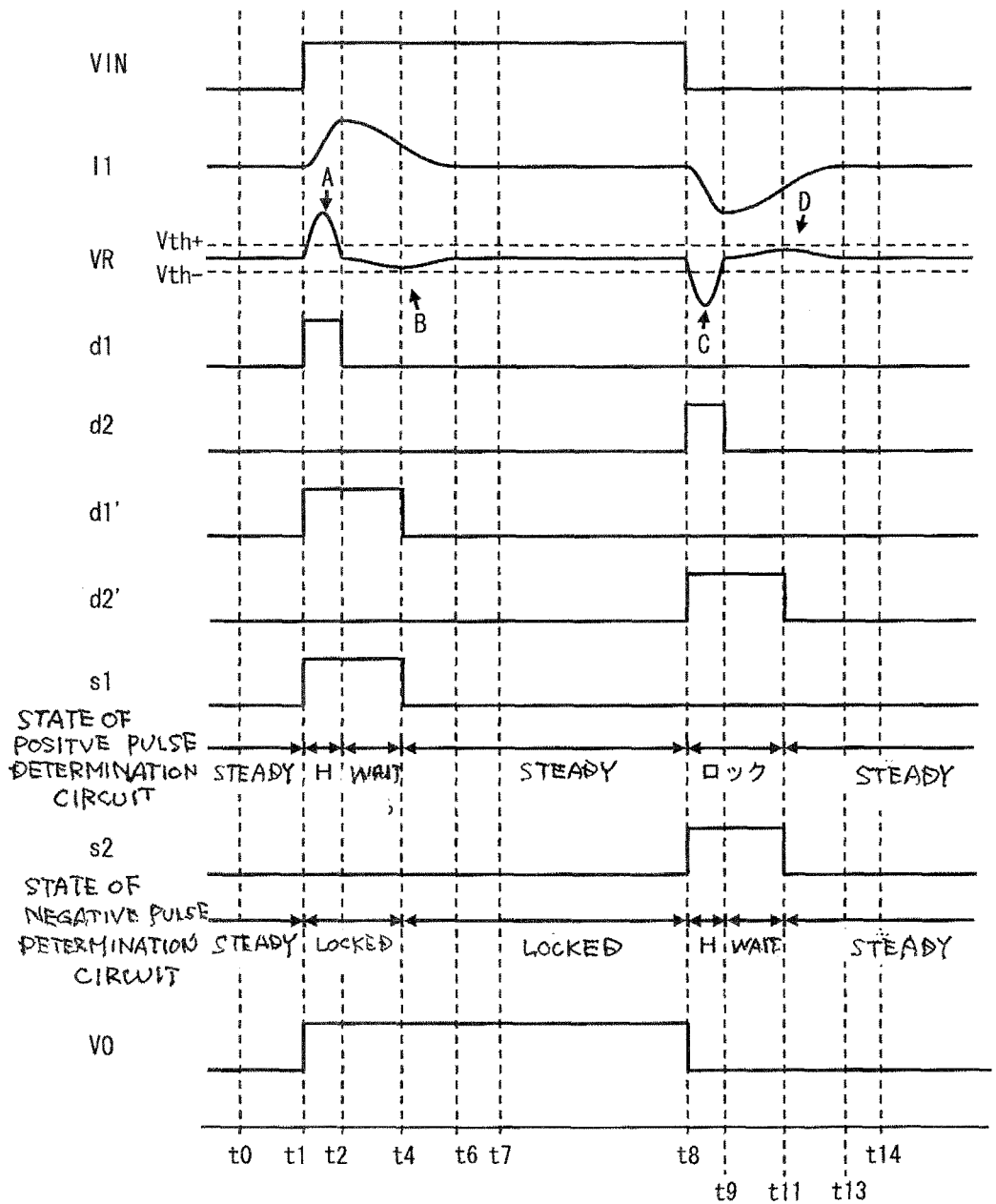

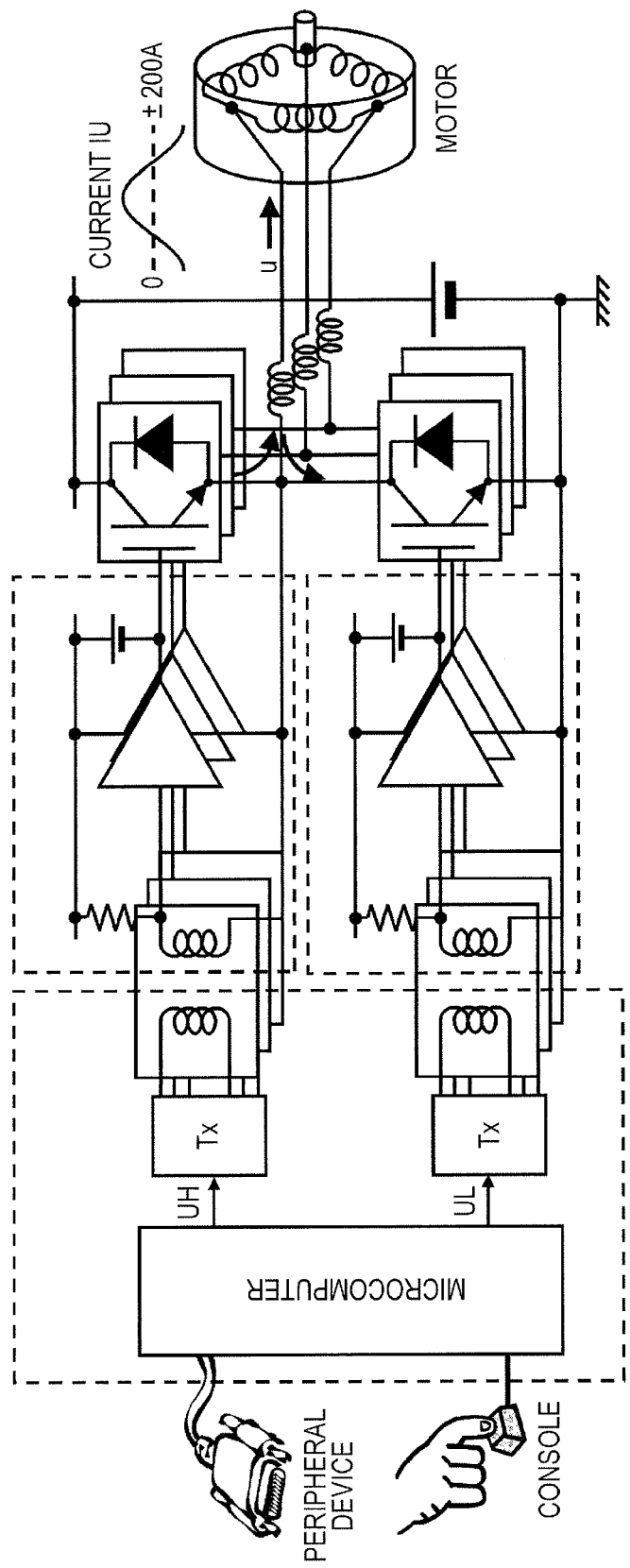

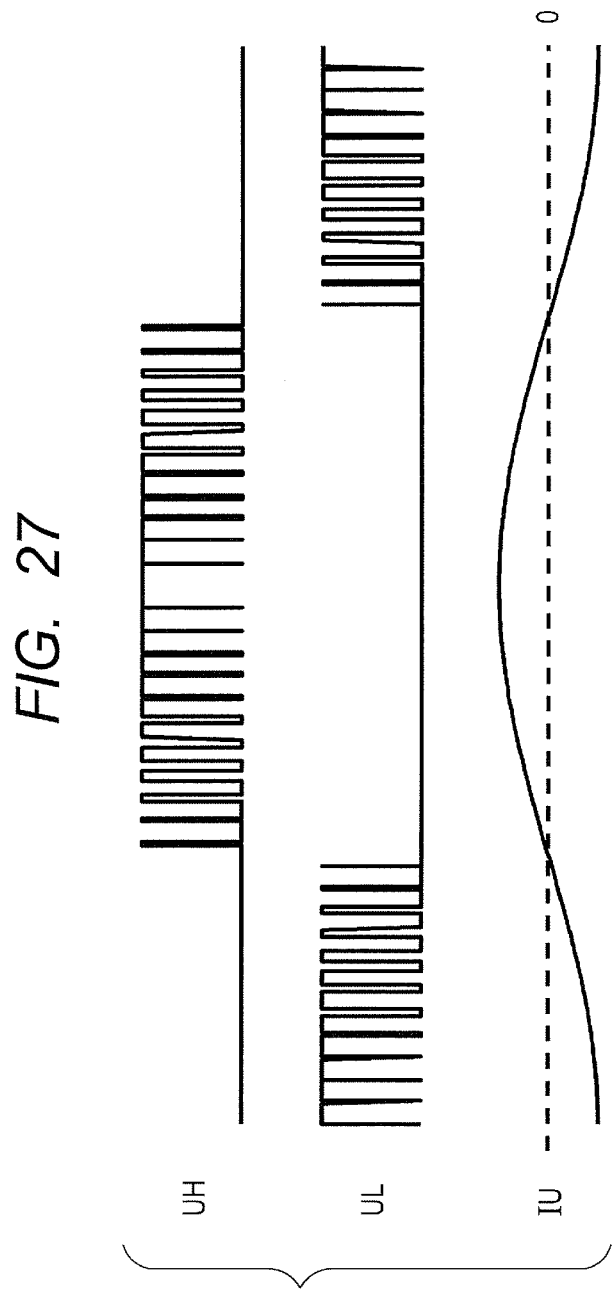

RECEIVER AND SEMICONDUCTOR INTEGRATED CIRCUIT HAVING THE SAME

CROSS-REFERENCE TO RELATED APPLICATIONS

The disclosure of Japanese Patent Application No. 2012-082323 filed on Mar. 30, 2012 including the specification, drawings, and abstract is incorporated herein by reference in its entirety.

BACKGROUND

The present invention relates to a receiver and to a semiconductor integrated circuit having the receiver. More specifically, the present invention relates to a receiver that receives a signal, for instance, through an AC-coupling element, and to a semiconductor integrated circuit having such a receiver.

When wiring is used to directly transmit a signal between a plurality of semiconductor chips that differ in power supply voltage, semiconductor chip breakage or signal transmission failure may occur due to a voltage difference in DC voltage components of the signal to be transmitted. Therefore, when a signal is to be transmitted between the semiconductor chips that differ in power supply voltage, an AC-coupling element is coupled between the semiconductor chips so as to transmit only an AC signal. A capacitor or a transformer may be used as the AC-coupling element.

A certain method of signal transmission through an AC-coupling element indicates the direction of data transition in accordance with the amplitude direction of a pulse signal to be transmitted. When, for instance, a pulse signal having a positive amplitude is transmitted, the level of data is found to have transitioned from L to H (risen). When a pulse signal having a negative amplitude is transmitted, the level of data is found to have transitioned from H to L (fallen). This signal transmission method has the following problem although it can reduce a current consumption and a circuit area as compared to the other signal transmission methods.

A case where a transformer is used as the AC-coupling element is explained below. When transmitting a pulse signal having a positive amplitude, this signal transmission method causes a current to flow temporarily from one end of a primary coil to the other end. A positive electromotive force (a pulse signal having a positive amplitude) is then generated in a secondary coil in accordance with an electrical current change in the primary coil. On the other hand, when transmitting a pulse signal having a negative amplitude, this signal transmission method causes a current to flow temporarily from the other end of the primary coil to the one end. A negative electromotive force (a pulse signal having a negative amplitude) is then generated in the secondary coil in accordance with an electrical current change in the primary coil.

If the current flowing from the one end of the primary coil to the other end is blocked when the pulse signal having a positive amplitude is transmitted, a negative electromotive force (a counter pulse having a negative amplitude) is generated in the secondary coil in accordance with an electrical current change in the primary coil. Similarly, if the current flowing from the other end of the primary coil to the one end is blocked when the pulse signal having a negative amplitude is transmitted, a positive electromotive force (a counter pulse having a positive amplitude) is generated in the secondary coil in accordance with an electrical current change in the primary coil. Therefore, the receiver may acquire such a counter pulse as a normal pulse signal that indicates the direction of data transition. In other words, the receiver may erroneously determine the logic value of data.

A solution to the above problem is disclosed in "A 2.5 kV isolation 35 kV/us CMR 250 Mbps 0.13 mA/Mbps digital isolator in standard CMOS with an on-chip small transformer" (S. Kaeriyama, S. Uchida, M. Furumiya, M. Okada, M. Mizuno, 2010 Symposium on VLSI Circuits, Technical Digest of Technical Papers, 2010, pp. 197-198).

A configuration disclosed in "A 2.5 kV isolation 35 kV/us CMR 250 Mbps 0.13 mA/Mbps digital isolator in standard CMOS with an on-chip small transformer" (S. Kaeriyama, S. Uchida, M. Furumiya, M. Okada, M. Mizuno, 2010 Symposium on VLSI Circuits, Technical Digest of Technical Papers, 2010, pp. 197-198) compares the amplitude of a pulse signal having a positive amplitude to the amplitude of a pulse signal having a negative amplitude to determine which pulse signal is a normal pulse signal indicative of the direction of data transition. A related art disclosed in the above document uses such a configuration to prevent the logic value of data from being erroneously determined.

Other related arts are disclosed in Japanese Unexamined Patent Publications Nos. Hei 8 (1996)-236696 and 2011-142175.

An integrated circuit disclosed in Japanese Unexamined Patent Publication No. Hei 8 (1996)-236696 has a three-dimensional structure formulated by vertically stacking integrated circuit chips. This integrated circuit is configured so that coupling inductance M is used to provide induction-based signal transmission between one portion of a vertically integrated circuit in one chip layer Ln and another portion of a vertically integrated circuit in another chip layer Lnx.

A configuration disclosed in Japanese Unexamined Patent Publication No. 2011-142175 includes an AC-coupling element and a receiver. The AC-coupling element generates a reception signal V2 whose voltage changes in accordance with electrical current changes in an input transmission signal V1. The receiver reproduces the transmission signal V1 from the reception signal V2 by performing an integration operation on a numerical value based on the order of differentiation from the transmission signal V1 to the reception signal V2.

SUMMARY

However, the configuration disclosed in "A 2.5 kV isolation 35 kV/us CMR 250 Mbps 0.13 mA/Mbps digital isolator in standard CMOS with an on-chip small transformer" (S. Kaeriyama, S. Uchida, M. Furumiya, M. Okada, M. Mizuno, 2010 Symposium on VLSI Circuits, Technical Digest of Technical Papers, 2010, pp. 197-198) requires a dedicated circuit (particularly, a passive element) for analog voltage comparison. Therefore, it cannot suppress an increase in circuit size. Other problems of the related arts and novel features of the present invention will be apparent from the accompanying drawings and from the detailed description that follows.

According to one aspect of the present invention, there is provided a receiver that includes a positive pulse determination circuit and a negative pulse determination circuit. The positive pulse determination circuit outputs a first determination result of a first logic value during a first period, which is an interval between the instant at which a pulse signal having a negative amplitude is detected and the instant at which neither a pulse signal having a positive amplitude nor a pulse signal having a negative amplitude is detected, and outputs the first determination result of a second logic value if a pulse signal having a positive amplitude is detected during a period different from the first period. The negative pulse determination circuit outputs a second determination result of one of the first and second logic values during a second period, which is an interval between the instant at which a pulse signal having a positive amplitude is detected and the instant at which neither a pulse signal having a positive amplitude nor a pulse signal having a negative amplitude is detected, and outputs the second determination result of the other of the first and second logic values if a pulse signal having a negative amplitude is detected during a period different from the second period.

According to another aspect of the present invention, there is provided a receiver that includes a positive pulse determination circuit and a negative pulse determination circuit. The positive pulse determination circuit outputs a first determination result of a first logic value during a predetermined period after the detection of a pulse signal having a negative amplitude, and outputs the first determination result of a second logic value if a pulse signal having a positive amplitude is detected during a period different from the predetermined period. The negative pulse determination circuit outputs a second determination result of one of the first and second logic values during a predetermined period after the detection of a pulse signal having a positive amplitude, and outputs the second determination result of the other of the first and second logic values if a pulse signal having a negative amplitude is detected during a period different from the predetermined period.

The above aspects of the present invention make it possible to provide a receiver that has a small-scale circuit configuration and can receive data with high accuracy.

BRIEF DESCRIPTION OF THE DRAWINGS

FIG. 10A is a timing diagram illustrating an operation of the receiver according to the second embodiment;

FIG. 10B is a timing diagram illustrating an operation of the receiver according to the second embodiment;

FIG. 26 is a diagram illustrating an inverter to which the semiconductor integrated circuit according to the first to third embodiments is applied; and FIG. 27 is a timing diagram illustrating an operation of the inverter to which the semiconductor integrated circuit according to the first to third embodiments is applied.

DETAILED DESCRIPTION

Figure 1:
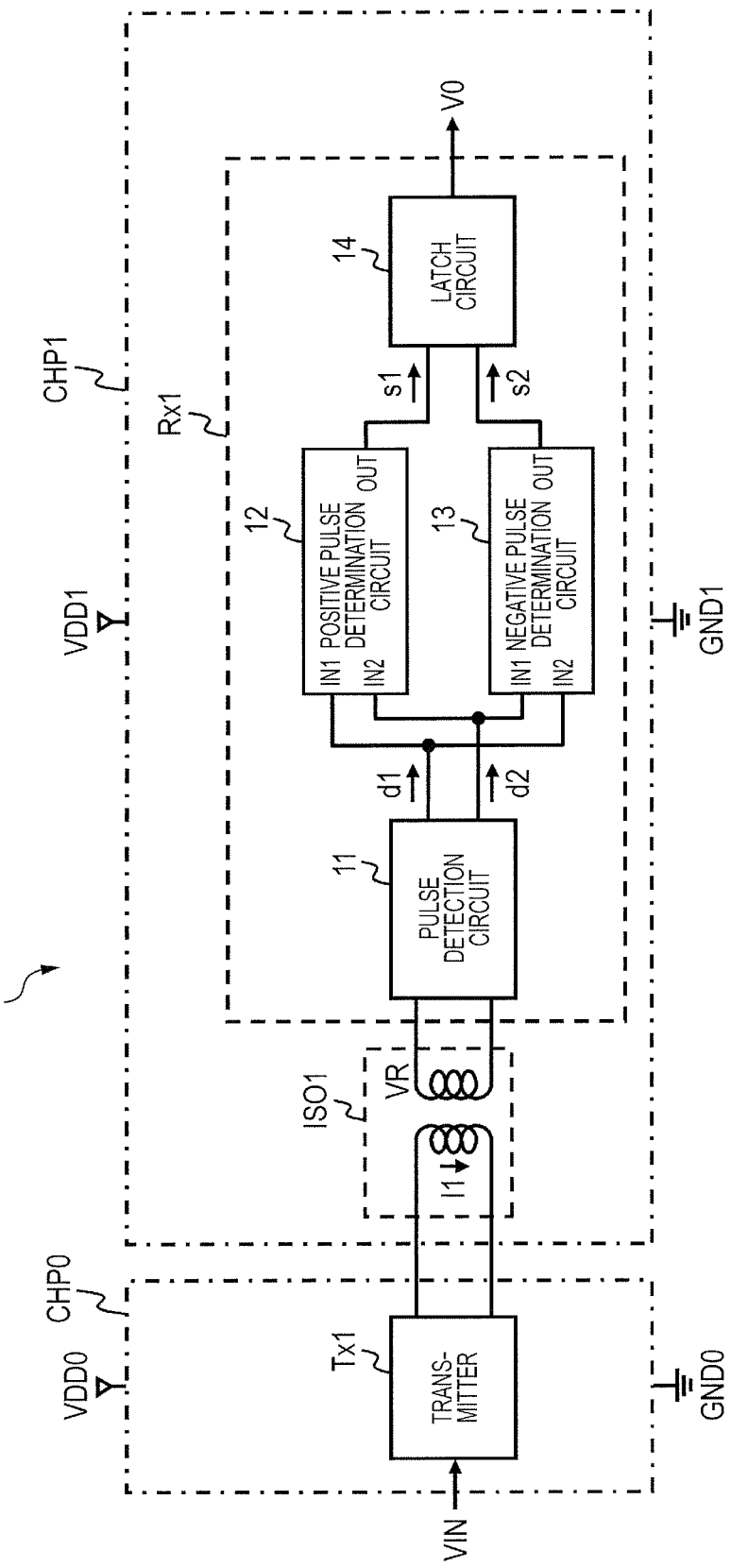
FIG. 1 is a block diagram illustrating a semiconductor integrated circuit according to a first embodiment of the present invention.

Embodiments of the present invention will now be described with reference to the accompanying drawings. As the drawings are simplified, they should not be used to narrowly interpret the technical scope of each embodiment. Like elements are designated by like reference numerals and will not be redundantly described.

In the following description of the embodiments, if necessary for convenience sake, a description of the present invention will be given in a divided manner in plural sections or embodiments, but unless specifically stated, they are not unrelated to each other, but are in a relation such that one is a modification, an application, a detailed explanation, or a supplementary explanation of a part or the whole of the other. Also, in the embodiments described below, when referring to the number of elements (including the number of pieces, numerical values, amounts, ranges, and the like), the number of elements is not limited to a specific number unless specifically stated or except the case where the number is apparently limited to a specific number in principle. The number larger or smaller than the specified number is also applicable.

Further, in the embodiments described below, their components (including operating steps and the like) are not always indispensable unless specifically stated or except the case where the components are apparently indispensable in principle. Similarly, in the embodiments described below, when the shape of the components, the positional relationship therebetween, and the like are mentioned, the substantially approximate and similar shapes and the like are included therein unless specifically stated or except the case where it is conceivable that they are apparently excluded in principle. The same goes for the aforementioned number of elements (including the number of pieces, numerical values, amounts, ranges, and the like).

First Embodiment

FIG. 1 is a block diagram illustrating an exemplary configuration of a semiconductor integrated circuit 1 that includes a receiver according to a first embodiment of the present invention to form an isolator. After detecting a pulse signal having a positive or negative amplitude and determining it as a normal pulse signal, the receiver according to the first embodiment does not determine any pulse signal as a normal pulse signal until it detects neither a pulse signal having a positive amplitude nor a pulse signal having a negative amplitude. Hence, the receiver according to the present embodiment can eliminate noise components (including a counter pulse) generated in a reception signal VR. This makes it possible to receive (reproduce) data with high accuracy. In this instance, the receiver according to the present embodiment does not include a dedicated circuit for analog voltage comparison unlike related arts and exercises digital control with a positive pulse determination circuit and with a negative pulse determination circuit. Therefore, data can be accurately received by using a small-scale circuit configuration.

The semiconductor integrated circuit 1 shown in FIG. 1 includes at least a transmitter Tx1, a receiver Rx1, and an AC-coupling element ISO1.

The transmitter Tx1 is formed over a semiconductor chip CHP0. The semiconductor chip CHP0 is driven by a first power supply (power supply voltage VDD0, ground voltage GND0), which belongs to a first power supply system.

The AC-coupling element ISO1 and the receiver Rx1 are formed over a semiconductor chip CHP1. The semiconductor chip CHP1 is driven by a second power supply (power supply voltage VDD1, ground voltage GND1), which belongs to a second power supply system.

The following description is given on the assumption that the AC-coupling element ISO1 is an inductor having a primary coil L11 and a secondary coil L12 (hereinafter simply referred to as the transformer). However, the present embodiment is not limited to the use of such an AC-coupling element. For example, a capacitive element (hereinafter simply referred to as the capacitor) or a GMR element may be used as the AC-coupling element ISO1. In other words, the present embodiment is applicable not only to an inductor isolator, which uses an inductor as the AC-coupling element ISO1, but also to a capacitively-coupled isolator based on a capacitive element and to a GMR isolator based on a GMR element.

The transformer is an AC-coupling element that transmits an AC signal from the primary coil L11 to the secondary coil L12 by converting an electrical signal to magnetism with the primary coil L11 and converting the magnetism to an electrical signal with the secondary coil L12.

Figure 2:
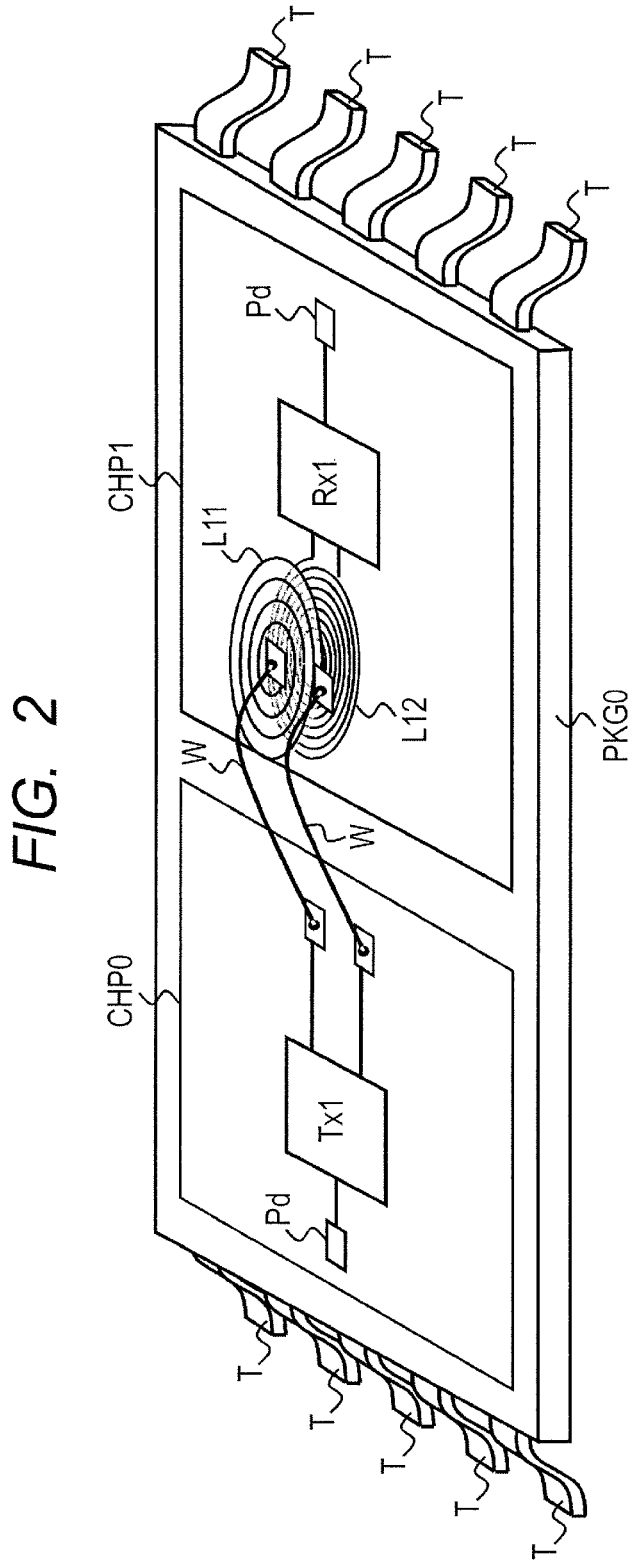
FIG. 2 is a schematic diagram illustrating how the semiconductor integrated circuit according to the first embodiment is implemented.

FIG. 2 is a diagram illustrating, as an example, how the semiconductor integrated circuit 1 is implemented. FIG. 2 mainly shows how the transmitter Tx1, the receiver Rx1, and the AC-coupling element ISO1, which is disposed between the transmitter Tx1 and the receiver Rx1, are mounted.

Referring to FIG. 2, the semiconductor chip CHP0 and the semiconductor chip CHP1 are mounted in a semiconductor package PKG0. The semiconductor chip CHP0 and the semiconductor chip CHP1 each have a pad Pd. The pad Pd of the semiconductor CHP0 and of the semiconductor chip CHP1 is coupled to a plurality of lead terminals (external terminals) T of the semiconductor package PKG0 through a bonding wire (not shown).

As shown in FIG. 2, the transmitter Tx1 is formed over the semiconductor chip CHP0. The receiver Rx1 and the primary and secondary coils L11, L12, which configure the AC-coupling element ISO1, are formed over the semiconductor chip CHP1. Further, the pad to be coupled to the output of the transmitter Tx1 is formed over the semiconductor chip CHP0, and the pad to be coupled to both ends of the primary coil L11 is formed over the semiconductor chip CHP1. The transmitter Tx1 is coupled through these pads and bonding wires W to the primary coil L11 formed over the semiconductor chip CHP1.

In the example shown in FIG. 2, the primary coil L11 and the secondary coil L12 are respectively formed in a first wiring layer and in a second wiring layer, which are vertically stacked in a single semiconductor chip.

Returning to FIG. 1, the exemplary configuration of the semiconductor integrated circuit 1 will be described in detail. The transmitter Tx1 operates from the first power supply, which belongs to the first power supply system. The receiver Rx1, on the other hand, operates from the second power supply, which belongs to the second power supply system.

The transmitter Tx1 outputs a transmission signal, which is a pulse signal having the direction of amplitude corresponding to the direction of transition of transmission data VIN supplied from the outside. When, for instance, the transmission data VIN transitions from the L level to the H level (rises), the transmitter Tx1 outputs a pulse signal (transmission signal) having a positive amplitude by causing a current I1 to flow temporarily from one end of the primary coil L11 to the other end. When, on the other hand, the transmission data VIN transitions from the H level to the L level (falls), the transmitter Tx1 outputs a pulse signal (transmission signal) having a negative amplitude by causing the current I1 to flow temporarily from the other end of the primary coil L11 to the one end.

The AC-coupling element ISO1 transmits the transmission signal, which is output from the transmitter Tx1, to the receiver Rx1 as the reception signal VR. More specifically, the AC-coupling element ISO1 operates so that the reception signal VR having a voltage level corresponding to a change in a current flowing to the primary coil L11 is generated in the secondary coil L12.

When, for instance, the transmitter Tx1 outputs a pulse signal (transmission signal) having a positive amplitude, that is, when the current I1 flows temporarily from one end of the primary coil L11 to the other end, a positive electromotive force (a pulse signal having a positive amplitude) is generated in the secondary coil L12 as the reception signal VR. When, on the other hand, the transmitter Tx1 outputs a pulse signal (transmission signal) having a negative amplitude, that is, when the current I1 flows temporarily from the other end of the primary coil L11 to the one end, a negative electromotive force (a pulse signal having a negative amplitude) is generated in the secondary coil L12 as the reception signal VR.

The receiver Rx1 reproduces the transmission data VIN in accordance with the reception signal VR from the AC-coupling element ISO1 and outputs the transmission data VIN as output data VO.

(Exemplary Configuration of Receiver Rx1)

The receiver Rx1 includes a pulse detection circuit 11, a positive pulse determination circuit (positive pulse determination section) 12, a negative pulse determination circuit (negative pulse determination section) 13, and a latch circuit (data generation section) 14.

The pulse detection circuit 11 detects a pulse signal (reception signal VR) having a positive amplitude and a pulse signal (reception signal VR) having a negative amplitude, which are generated in the secondary coil L12, and outputs the detected reception signals VR as a detection result (first detection result) d1 and as a detection result (second detection result) d2, respectively. When, for instance, the voltage level of the reception signal VR is not lower than a high-level threshold voltage Vth+, the pulse detection circuit 11 detects a pulse signal having a positive amplitude, and outputs an H-level detection result d1 during the detection of such a pulse signal. When, on the other hand, the voltage level of the reception signal VR is lower than the high-level threshold voltage Vth+, the pulse detection circuit 11 does not detect a pulse signal having a positive amplitude, and outputs an L-level detection result d1. Similarly, when the voltage level of the reception signal VR is not higher than a low-level threshold voltage Vth−, the pulse detection circuit 11 detects a pulse signal having a negative amplitude, and outputs an H-level detection result d2 during the detection of such a pulse signal. When, on the other hand, the voltage level of the reception signal VR is higher than the low-level threshold voltage Vth−, the pulse detection circuit 11 does not detect a pulse signal having a negative amplitude, and outputs an L-level detection result d2.

The positive pulse determination circuit 12 determines a pulse signal having a positive amplitude, which indicates a rise of the transmission data VIN, in accordance with the detection results d1, d2 output from the pulse detection circuit 11, and outputs the result of determination as a determination result (first determination result) s1. More specifically, the positive pulse determination circuit 12 outputs an L-level (first logic value) determination result (first determination result) s1 during a period (first period) between the instant at which the detection result d2 is at the H level and the instant at which the detection results d1, d2 are both at the L level, and outputs an H-level (second logic value) determination result (first determination result) s1 if the detection result d1 is at the H level during the other period.

The negative pulse determination circuit 13 determines a pulse signal having a negative amplitude, which indicates a fall of the transmission data VIN, in accordance with the detection results d1, d2 output from the pulse detection circuit 11, and outputs the result of determination as a determination result (second determination result) s2. More specifically, the negative pulse determination circuit 13 outputs an L-level (first logic value) determination result (second determination result) s2 during a period (second period) between the instant at which the detection result d1 is at the H level and the instant at which the detection results d1, d2 are both at the L level, and outputs an H-level (second logic value) determination result (second determination result) s2 if the detection result d2 is at the H level during the other period.

The positive and negative pulse determination circuits 12, 13 have the same circuit configuration. However, the positive pulse determination circuit 12 uses an input terminal IN1 to receive the supply of the detection result d1, uses an input terminal IN2 to receive the supply of the detection result d2, and uses an output terminal OUT to output the determination result s1. Meanwhile, the negative pulse determination circuit 13 uses an input terminal IN1 to receive the supply of the detection result d2, uses an input terminal IN2 to receive the supply of the detection result d1, and uses an output terminal OUT to output the determination result s2.

(State Transition Diagram of Positive Pulse Determination Circuit 12 and Negative Pulse Determination Circuit 13)

Figure 3:
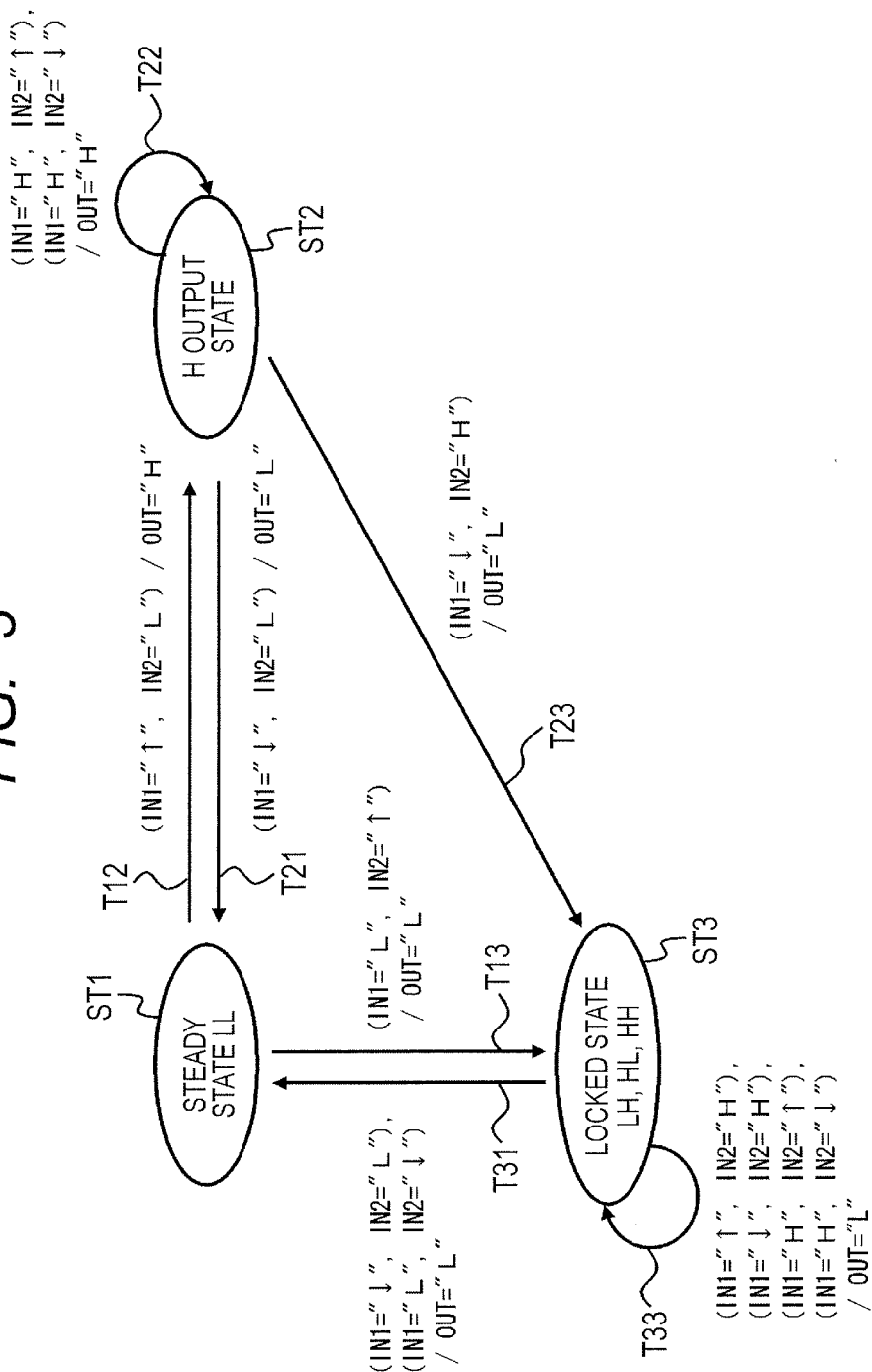
FIG. 3 is a state transition diagram illustrating a positive pulse determination circuit and negative pulse determination circuit according to the first embodiment.

A basic operation of the positive pulse determination circuit 12 will now be described with reference to FIG. 3. FIG. 3 is a state transition diagram of the positive pulse determination circuit 12 (negative pulse determination circuit 13). The symbols "IN1", "IN2", and "OUT" in FIG. 3 represent the input terminals and output terminal of the positive pulse determination circuit 12 (negative pulse determination circuit 13), respectively. Here, it is assumed that IN1=d1, and that IN2=d2, and further that OUT=s1.

First of all, in a steady state (ST1), the positive pulse determination circuit 12 outputs the L-level determination result s1 in accordance with the L-level detection results d1, d2.

If, for instance, the detection result d1 rises in the steady state, the positive pulse determination circuit 12 outputs the H-level determination result s1 (T12). The positive pulse determination circuit 12 then transitions from the steady state (ST1) to an H output state (ST2).

Meanwhile, if the detection result d2 rises in the steady state, the positive pulse determination circuit 12 continuously outputs the L-level determination result s1 (T13). The positive pulse determination circuit 12 then transitions from the steady state (ST1) to a locked state (ST3).

Next, if the detection result d1 remains at the H level in the H output state, the positive pulse determination circuit 12 continuously outputs the H-level determination result s1 (T22) no matter whether the detection result d2 rises or falls. In this instance, the positive pulse determination circuit 12 remains in the H output state (ST2).

Meanwhile, if, in the H output state, the detection result d2 is at the L level and the detection result d1 falls, the positive pulse determination circuit 12 outputs the L-level determination result s1 (T21). The positive pulse determination circuit 12 then transitions from the H output state (ST2) to the steady state (ST1).

If, in the H output state, the detection result d2 is at the H level and the detection result d1 falls, the positive pulse determination circuit 12 outputs the L-level determination result s1 (T23). The positive pulse determination circuit 12 then transitions from the H output state (ST2) to the locked state (ST3).

Next, if, in the locked state, one of the detection results d1, d2 is at the H level, the positive pulse determination circuit 12 continuously outputs the L-level determination result s1 (T33) without regard to the transition (rise or fall) of the other one of the detection results d1, d2. In this instance, the positive pulse determination circuit 12 remains in the locked state (ST3).

Meanwhile, if, in the locked state, one of the detection results d1, d2 is at the L level and the other one of the detection results d1, d2 falls, the positive pulse determination circuit 12 continuously outputs the L-level determination result s1 (T31). The positive pulse determination circuit 12 then transitions from the locked state (ST3) to the steady state (ST1).

A basic operation of the negative pulse determination circuit 13 will now be described with reference to FIG. 3. Here, it is assumed that IN1=d2, and that IN2=d1, and further that OUT=s2.

First of all, in the steady state (ST1), the negative pulse determination circuit 13 outputs the L-level (first logic value) determination result s2 in accordance with the L-level detection results d1, d2.

If, for instance, the detection result d2 rises in the steady state, the negative pulse determination circuit 13 outputs the H-level (second logic value) determination result s2 (T12). The negative pulse determination circuit 13 then transitions from the steady state (ST1) to the H output state (ST2).

Meanwhile, if the detection result d1 rises in the steady state, the negative pulse determination circuit 13 continuously outputs the L-level determination result s2 (T13). The negative pulse determination circuit 13 then transitions from the steady state (ST1) to the locked state (ST3).

Next, if the detection result d2 remains at the H level in the H output state, the negative pulse determination circuit 13 continuously outputs the H-level determination result s2 (T22) without regard to the transition (rise or fall) of the detection result d1. In this instance, the negative pulse determination circuit 13 remains in the H output state (ST2).

Meanwhile, if, in the H output state, the detection result d1 is at the L level and the detection result d2 falls, the negative pulse determination circuit 13 outputs the L-level determination result s2 (T21). The negative pulse determination circuit 13 then transitions from the H output state (ST2) to the steady state (ST1).

If, in the H output state, the detection result d1 is at the H level and the detection result d2 falls, the negative pulse determination circuit 13 outputs the L-level determination result s2 (T23). The negative pulse determination circuit 13 then transitions from the H output state (ST2) to the locked state (ST3).

Next, if, in the locked state, one of the detection results d1, d2 is at the H level, the negative pulse determination circuit 13 continuously outputs the L-level determination result s2 (T33) without regard to the transition (rise or fall) of the other one of the detection results d1, d2. In this instance, the negative pulse determination circuit 13 remains in the locked state (ST3).

Meanwhile, if, in the locked state, one of the detection results d1, d2 is at the L level and the other one of the detection results d1, d2 falls, the negative pulse determination circuit 13 continuously outputs the L-level determination result s2 (T31). The negative pulse determination circuit 13 then transitions from the locked state (ST3) to the steady state (ST1).

Returning to FIG. 1, the latch circuit 14 outputs output data (data) VO in accordance with the determination result s1 output from the positive pulse determination circuit 12 and with the determination result s2 output from the negative pulse determination circuit 13.

The latch circuit 14 is a so-called SR latch circuit. The latch circuit 14 uses a set input terminal S to receive the supply of the determination result s1, uses a reset input terminal R to receive the supply of the determination result s2, and uses an output terminal Q to output the output data VO.

(Timing Diagram)

Figure 4A:
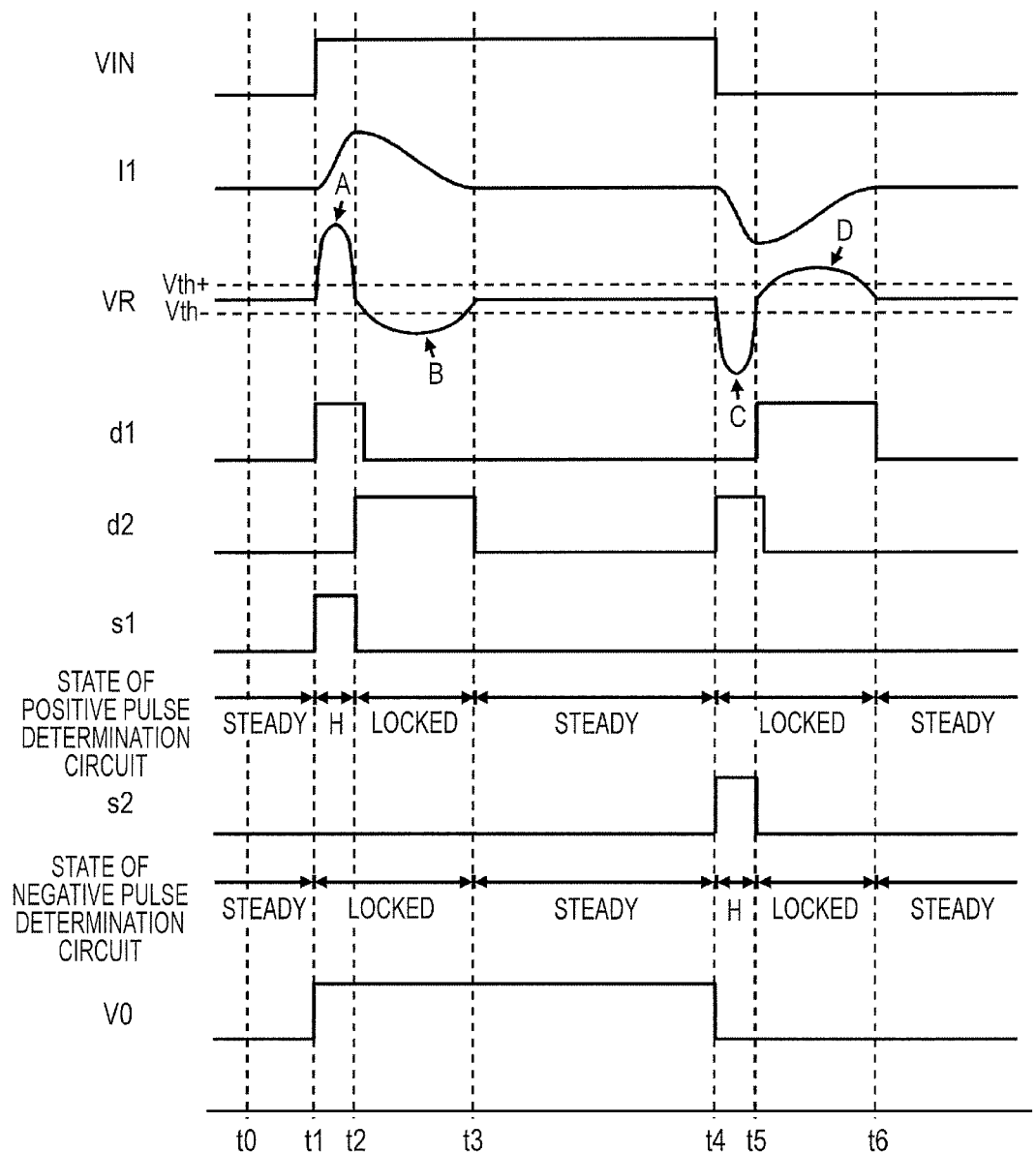
FIG. 4A is a timing diagram illustrating an operation of a receiver according to the first embodiment.

An operation of the receiver Rx1 will now be described with reference to FIG. 4A. FIG. 4A is a timing diagram illustrating an exemplary operation of the receiver Rx1. The operation depicted in FIG. 4A can be performed not only when a transformer is used as the AC-coupling element ISO1, but also when, for instance, a capacitor or a GMR element is used as the AC-coupling element ISO1.

In an initial state (time t0), the transmission data VIN is at the L level. Hence, the transmitter Tx1 does not cause the current I1 to flow to the primary coil L11 (I1=approximately 0 A). Therefore, the reception signal VR remains at a reference voltage. The pulse detection circuit 11 does not detect a pulse signal having a positive amplitude or a pulse signal having a negative amplitude. Thus, the pulse detection circuit 11 outputs the L-level detection results d1, d2 in these cases. Hence, the positive pulse determination circuit 12 outputs the L-level determination result s1, whereas the negative pulse determination circuit 13 outputs the L-level determination result s2. In other words, the positive pulse determination circuit 12 and the negative pulse determination circuit 13 are both in the steady state (ST1). Consequently, the latch circuit 14 outputs L-level output data VO.

When the transmission data VIN transitions from the L level to the H level (time t1), the transmitter Tx1 outputs a pulse signal (transmission signal) having a positive amplitude by causing the current I1 to flow temporarily from one end of the primary coil L11 to the other end (time t1 to time t3). Hence, a positive electromotive force (a pulse signal having a positive amplitude) corresponding to an electrical current change in the primary coil L11 is generated in the secondary coil L12 as the reception signal VR (A in FIG. 4A) (time t1 to time t2). If, in this instance, the current I1 flowing from one end of the primary coil L11 to the other end is blocked, a negative electromotive force (a counter pulse having a negative amplitude) corresponding to an electrical current change in the primary coil is also generated in the secondary coil L12 as the reception signal VR (B in FIG. 4A) (time t2 to time t3).

While the pulse signal having a positive amplitude is not lower than the threshold voltage Vth+, the pulse detection circuit 11 outputs the H-level detection result d1 (time t1 to time t2). Further, while the counter pulse having a negative amplitude is not higher than the threshold voltage Vth−, the pulse detection circuit 11 outputs the H-level detection result d2 (time t2 to time t3). In reality, adjustments are made so that the period during which the detection result d1 is at the H level overlaps with the period during which the detection result d2 is at the H level. Although the counter pulse having a negative amplitude is not always equal to or lower than the threshold voltage Vth−, the example shown in FIG. 4A is described on the assumption that the counter pulse having a negative amplitude is unintentionally equal to or lower than the threshold voltage Vth−.

The positive pulse determination circuit 12 outputs the H-level determination result s1 during an interval between the instant at which at least the detection result d1 rises and the instant at which the detection result d1 is at the H level (time t1 to time t2), and continuously outputs the L-level determination result s1 during an interval between the instant at which the detection result d1 falls (the detection result d2 rises) and the instant at which the detection results d1, d2 are both at the L level (time t2 to time t3).

More specifically, the positive pulse determination circuit 12 operates in accordance with the state transition diagram of FIG. 3.

First of all, when the detection result d1 supplied to the input terminal IN1 rises, the positive pulse determination circuit 12 outputs the H-level determination result s1 (time t1). The positive pulse determination circuit 12 then transitions from the steady state (ST1) to the H output state (ST2).

Next, when the detection result d2 supplied to the input terminal IN2 rises to the H level simultaneously with the fall of the detection result d1, the positive pulse determination circuit 12 outputs the L-level determination result s1 (time t2). The positive pulse determination circuit 12 then transitions from the H output state (ST2) to the locked state (ST3).

Next, when the detection result d2 falls, the positive pulse determination circuit 12 continuously outputs the L-level determination result s1 (time t3). The positive pulse determination circuit 12 then transitions from the locked state (ST3) to the steady state (ST1).

Meanwhile, the negative pulse determination circuit 13 continuously outputs the L-level determination result s2 during an interval between the instant at which the detection result d1 rises and the instant at which the detection results d1, d2 are both at the L level (time t1 to time t3).

More specifically, the negative pulse determination circuit 13 also operates in accordance with the state transition diagram of FIG. 3.

First of all, when the detection result d1 supplied to the input terminal IN2 rises, the negative pulse determination circuit 13 outputs the L-level determination result s2 (time t1). The negative pulse determination circuit 13 then transitions from the steady state (ST1) to the locked state (ST3).

Next, even when the detection result d1 falls, the negative pulse determination circuit 13 continuously outputs the L-level determination result s2 (time t2) because the detection result d2 supplied to the input terminal IN1 has risen and is at the H level. In this instance, the negative pulse determination circuit 13 remains in the locked state (ST3).

Next, when the detection result d2 falls, the negative pulse determination circuit 13 continuously outputs the L-level determination result s2 (time t3). The negative pulse determination circuit 13 then transitions from the locked state (ST3) to the steady state (ST1).

Subsequently, when the transmission data VIN transitions from the H level to the L level (time t4), the transmitter Tx1 outputs a pulse signal (transmission signal) having a negative amplitude by causing a current to flow temporarily from the other end of the primary coil L11 to the one end (time t4 to time t6). Hence, a negative electromotive force (a pulse signal having a negative amplitude) corresponding to an electrical current change in the primary coil L11 is generated in the secondary coil L12 as the reception signal VR (C in FIG. 4A) (time t4 to time t5). If, in this instance, the current I1, which flows from the other end of the primary coil L11 to the one end, is blocked, a positive electromotive force (a counter pulse having a positive amplitude) corresponding to an electrical current change in the primary coil is also generated in the secondary coil L12 as the reception signal VR (D in FIG. 4A) (time t5 to time t6).

While the pulse signal having a negative amplitude is not higher than the threshold voltage Vth−, the pulse detection circuit 11 outputs the H-level detection result d2 (time t4 to time t5). Further, while the counter pulse having a positive amplitude is not lower than the threshold voltage Vth+, the pulse detection circuit 11 outputs the H-level detection result d1 (time t5 to time t6). In reality, adjustments are made so that the period during which the detection result d2 is at the H level overlaps with the period during which the detection result d1 is at the H level. Although the counter pulse having a positive amplitude is not always equal to or higher than the threshold voltage Vth+, the example shown in FIG. 4A is described on the assumption that the counter pulse having a positive amplitude is unintentionally equal to or higher than the threshold voltage Vth+.

The positive pulse determination circuit 12 continuously outputs the L-level determination result s1 during an interval between the instant at which the detection result d2 rises and the instant at which the detection result d2 is at the H level and during an interval between the instant at which the detection result d2 rises and the instant at which the detection results d1, d2 are both at the L level (time t4 to time t6).

In reality, the positive pulse determination circuit 12 operates in accordance with the state transition diagram of FIG. 3. The operation performed by the positive pulse determination circuit 12 between time t4 and time t6 will not be described because it is the same as the operation performed by the negative pulse determination circuit 13 between time t1 and time t3. However, the "detection result d1" and "detection result d2" should be read as the "detection result d2" and "detection result d1", respectively, and the "determination result s2" should be read as the "determination result s1".

Meanwhile, the negative pulse determination circuit 13 outputs the H-level determination result s2 during an interval between the instant at which at least the detection result d2 rises and the instant at which the detection result d2 is at the H level (time t4 to time t5), and continuously outputs the L-level determination result s2 during an interval between the instant at which the detection result d2 falls (the detection result d1 rises) and the instant at which the detection results d1, d2 are both at the L level (time t5 to time t6).

In reality, the negative pulse determination circuit 13 operates in accordance with the state transition diagram of FIG. 3. The operation performed by the negative pulse determination circuit 13 between time t4 and time t6 will not be described because it is the same as the operation performed by the positive pulse determination circuit 12 between time t1 and time t3. However, the "detection result d1" and "detection result d2" should be read as the "detection result d2" and "detection result d1", respectively, and the "determination result s1" should be read as the "determination result s2".

The latch circuit 14 causes the output data VO to rise in synchronism with the rise of the determination result s1 (time t1), and causes the output data VO to fall in synchronism with the rise of the determination result s2 (time t4).

As described above, the receiver Rx1 receives (reproduces) data with high accuracy by eliminating noise components (including a counter pulse) generated in the secondary coil L12.

Referring to FIG. 4A, the period (first period) between the instant at which the detection result d2 is at the H level and the instant at which the detection results d1, d2 are both at the L level is a period between time t4 and time t6 and a period between time t2 and time t3. The period (second period) between the instant at which the detection result d1 is at the H level and the instant at which the detection results d1, d2 are both at the L level is a period between time t1 and time t3 and a period between time t5 and time t6.

FIG. 4A is used to describe a case where a counter pulse having a negative amplitude is detected (time t2 to time t3) and a counter pulse having a positive amplitude is detected (time t5 to time t6). However, the counter pulse having a negative or positive amplitude may not be detected depending, for instance, on the settings of the threshold voltages Vth+, Vth− and on the operating conditions (temperature and power supply voltage). Even in such a case, it is natural that the receiver Rx1 can accurately receive data.

Figure 4B:
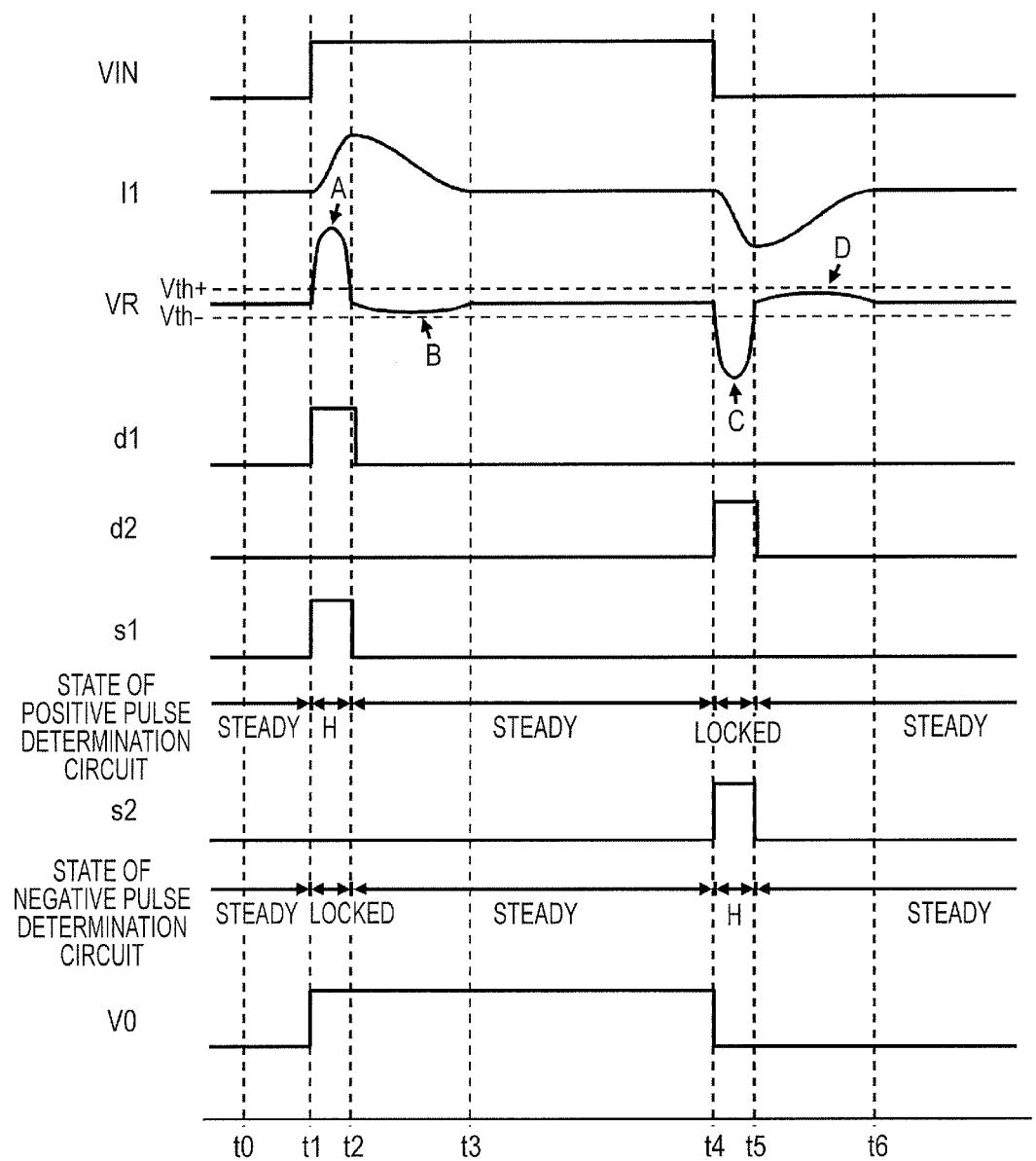
FIG. 4B is a timing diagram illustrating an operation of the receiver according to the first embodiment.

FIG. 4B is a timing diagram illustrating another operation of the receiver Rx1. The timing diagram of FIG. 4B differs from the timing diagram of FIG. 4A in that no counter pulse is detected. FIG. 4B also indicates that the receiver Rx1 receives (reproduces) data with high accuracy. The other operation depicted in the timing diagram of FIG. 4B will not be described because it is the same as depicted in FIG. 4A.

(Exemplary Detailed Configuration of Positive Pulse Determination Circuit 12 and Negative Pulse Determination Circuit 13)

Figure 5:
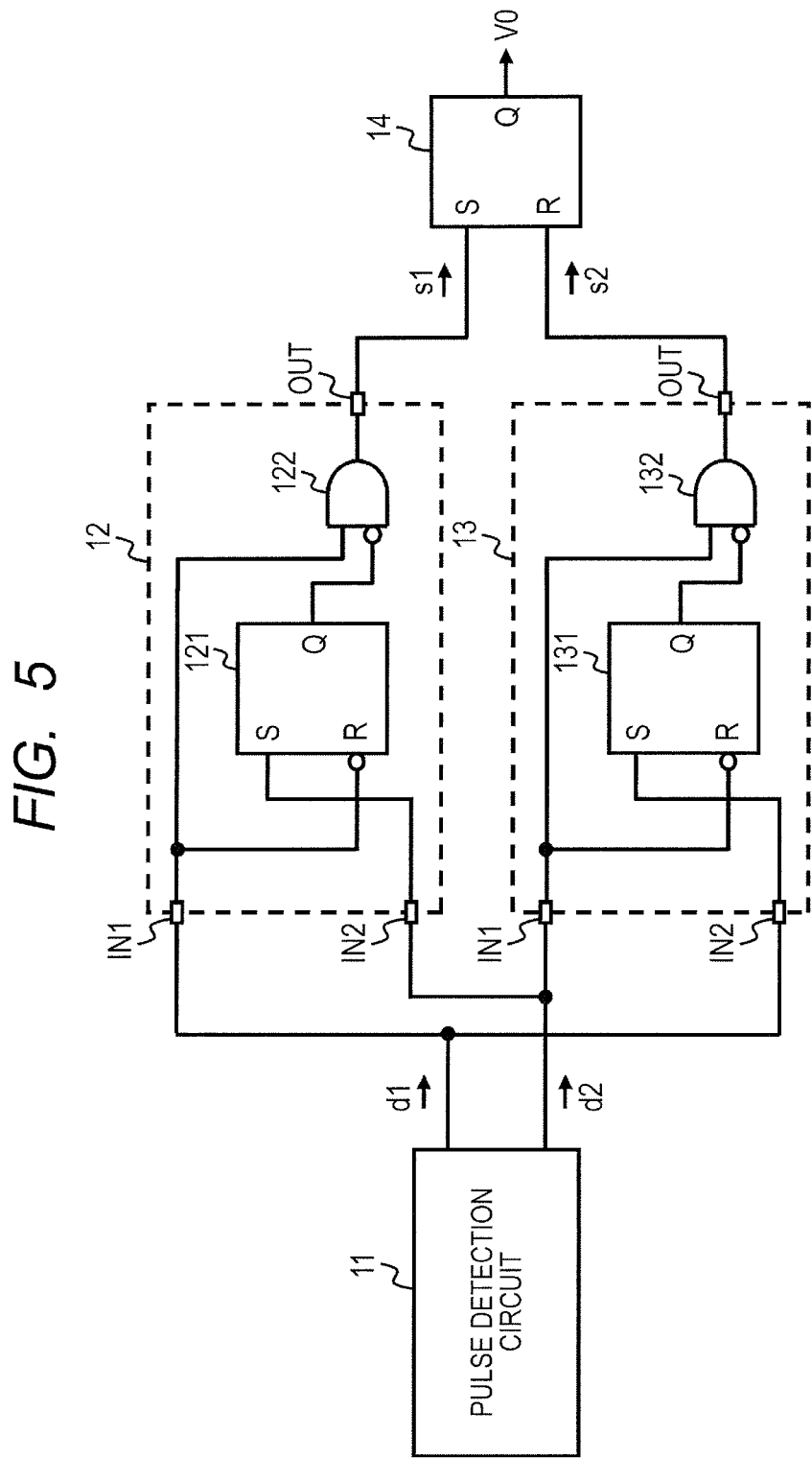
FIG. 5 is a diagram illustrating an exemplary detailed configuration of the positive pulse determination circuit and negative pulse determination circuit according to the first embodiment.

FIG. 5 is a diagram illustrating an exemplary detailed configuration of the positive pulse determination circuit 12 and negative pulse determination circuit 13.

Referring to FIG. 5, the positive pulse determination circuit 12 includes an SR latch circuit (first SR latch circuit) 121 and a logical AND circuit (first logical AND circuit) (hereinafter simply referred to as the AND circuit) 122. The negative pulse determination circuit 13 includes an SR latch circuit (second SR latch circuit) 131 and an AND circuit (second logical AND circuit) 132.

The SR latch circuit 121 uses a set input terminal S to receive the supply of the detection result d2 from the pulse detection circuit 11, uses a reset input terminal R to receive the supply of an inverted signal of the detection result d1 from the pulse detection circuit 11, and uses an output terminal Q to output an intermediate signal (first intermediate signal). The AND circuit 122 outputs the logical AND of the detection result d1 and the intermediate signal from the SR latch circuit 121 as the determination result s1.

The SR latch circuit 131 uses a set input terminal S to receive the supply of the detection result d1 from the pulse detection circuit 11, uses a reset input terminal R to receive the supply of an inverted signal of the detection result d2 from the pulse detection circuit 11, and uses an output terminal Q to output an intermediate signal (second intermediate signal). The AND circuit 132 outputs the logical AND of the detection result d2 and the intermediate signal from the SR latch circuit 131 as the determination result s2.

Figure 6:
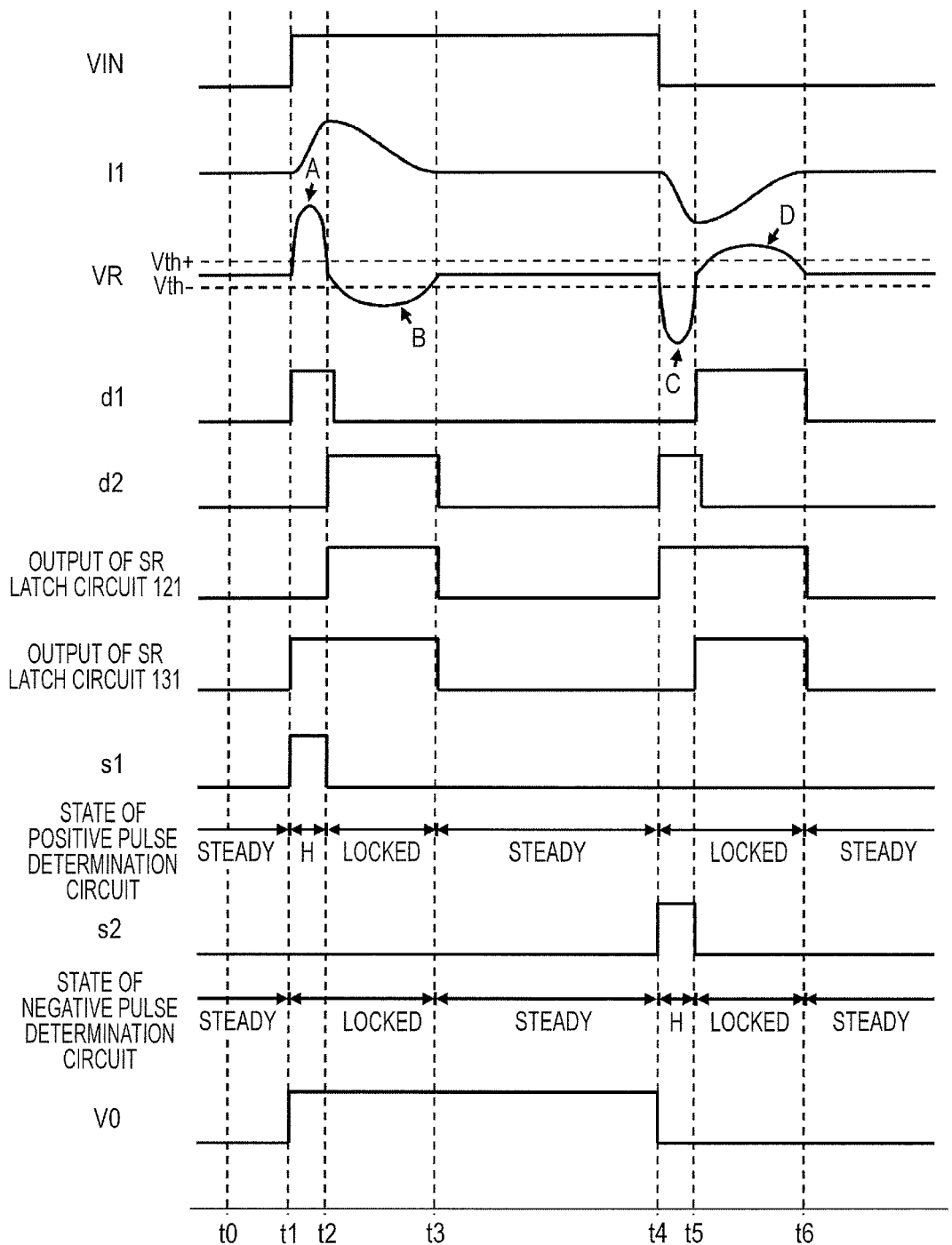
FIG. 6 is a timing diagram illustrating an operation of the receiver according to the first embodiment.

FIG. 6 is a timing diagram illustrating an operation that is performed by the receiver Rx1 when the positive pulse determination circuit 12 and the negative pulse determination circuit 13 are configured as shown in FIG. 5. The timing diagram of FIG. 6 also depicts the output signals of the SR latch circuits 121, 131. In the example shown in FIG. 6, each SR latch circuit 121, 131 outputs an H-level signal when a set signal and a reset signal are both active (at the H level). In other words, the set signal takes precedence. The other portion of FIG. 6 will not be described because it is the same as indicated in FIG. 4A.

When a pulse signal having a positive or negative amplitude is detected and determined as a normal pulse signal, the receiver Rx1 according to the present embodiment does not determine any pulse signal as a normal pulse signal until neither a pulse signal having a positive amplitude nor a pulse signal having a negative amplitude is detected. Hence, the receiver Rx1 according to the present embodiment can eliminate noise components (including a counter pulse) generated in the reception signal VR. This enables the receiver Rx1 according to the present embodiment to receive (reproduce) data with high accuracy. In this instance, the receiver Rx1 according to the present embodiment does not have a dedicated circuit for analog voltage comparison unlike related arts and exercises digital control with a positive pulse determination circuit and with a negative pulse determination circuit. This makes it possible to accurately receive data by using a small-scale circuit configuration.

Second Embodiment

Figure 7:
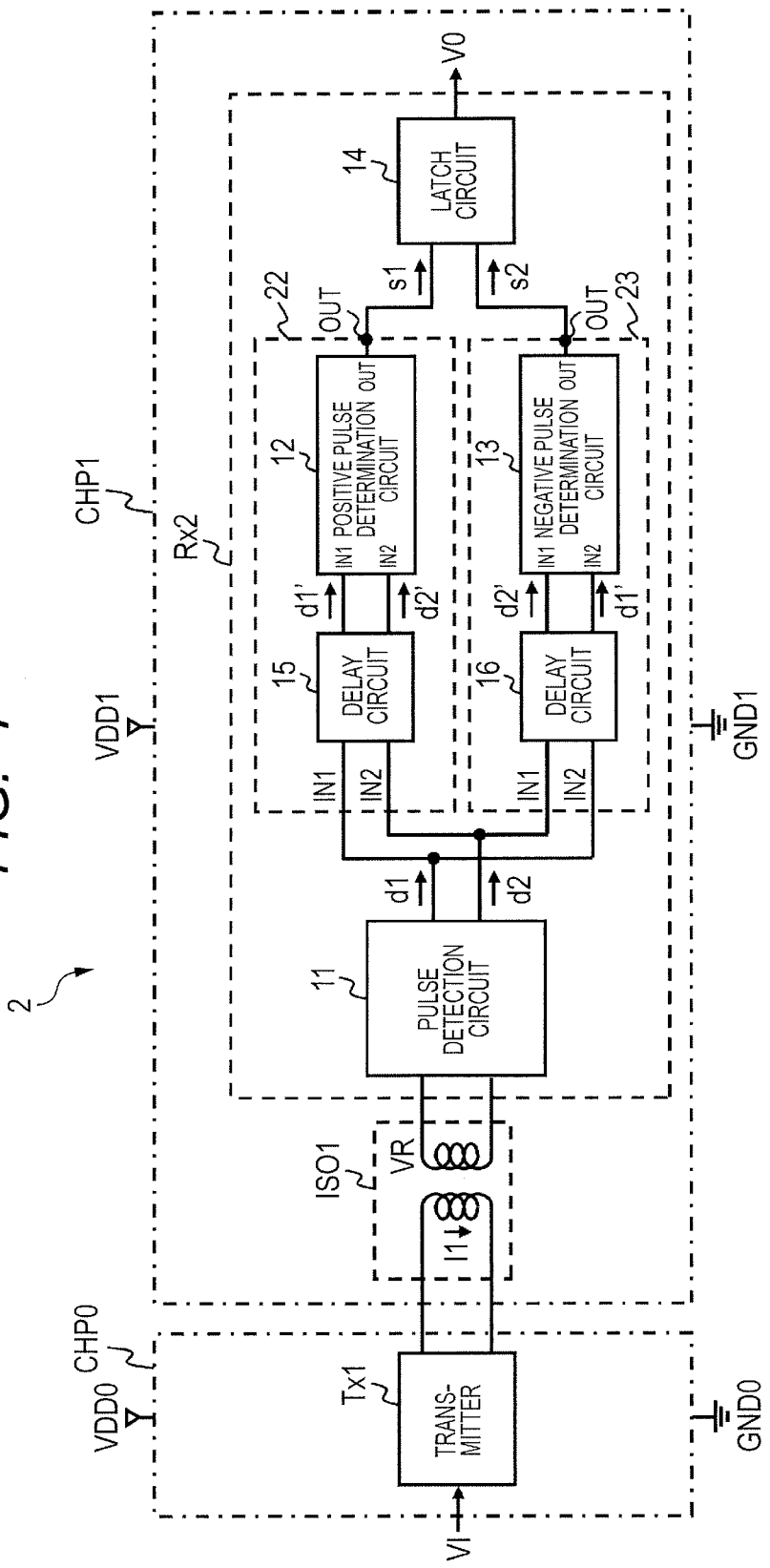
FIG. 7 is a block diagram illustrating the semiconductor integrated circuit according to a second embodiment of the present invention.

FIG. 7 is a block diagram illustrating an exemplary configuration of a semiconductor integrated circuit 2 that includes a receiver Rx2 according to a second embodiment of the present invention to form an isolator. The second embodiment will now be described in detail.

The semiconductor integrated circuit 2 shown in FIG. 7 differs from the semiconductor integrated circuit 1 shown in FIG. 1 in that the former includes the receiver Rx2 in place of the receiver Rx1. The circuit configuration of the other portion of the semiconductor integrated circuit 2 shown in FIG. 7 will not be described because it is the same as that of the semiconductor integrated circuit 1 shown in FIG. 1.

The receiver Rx2 differs from the receiver Rx1 in that the former further includes delay circuits 15, 16. The delay circuits 15, 16 output detection results d1', d2', which are obtained by significantly delaying the falls of the detection results d1, d2 of the pulse detection circuit 11 from their rises. The delay circuit 15 and the positive pulse determination circuit 12 form a positive pulse determination section 22. The delay circuit 16 and the negative pulse determination circuit 13 form a negative pulse determination section 23.

Figure 8:
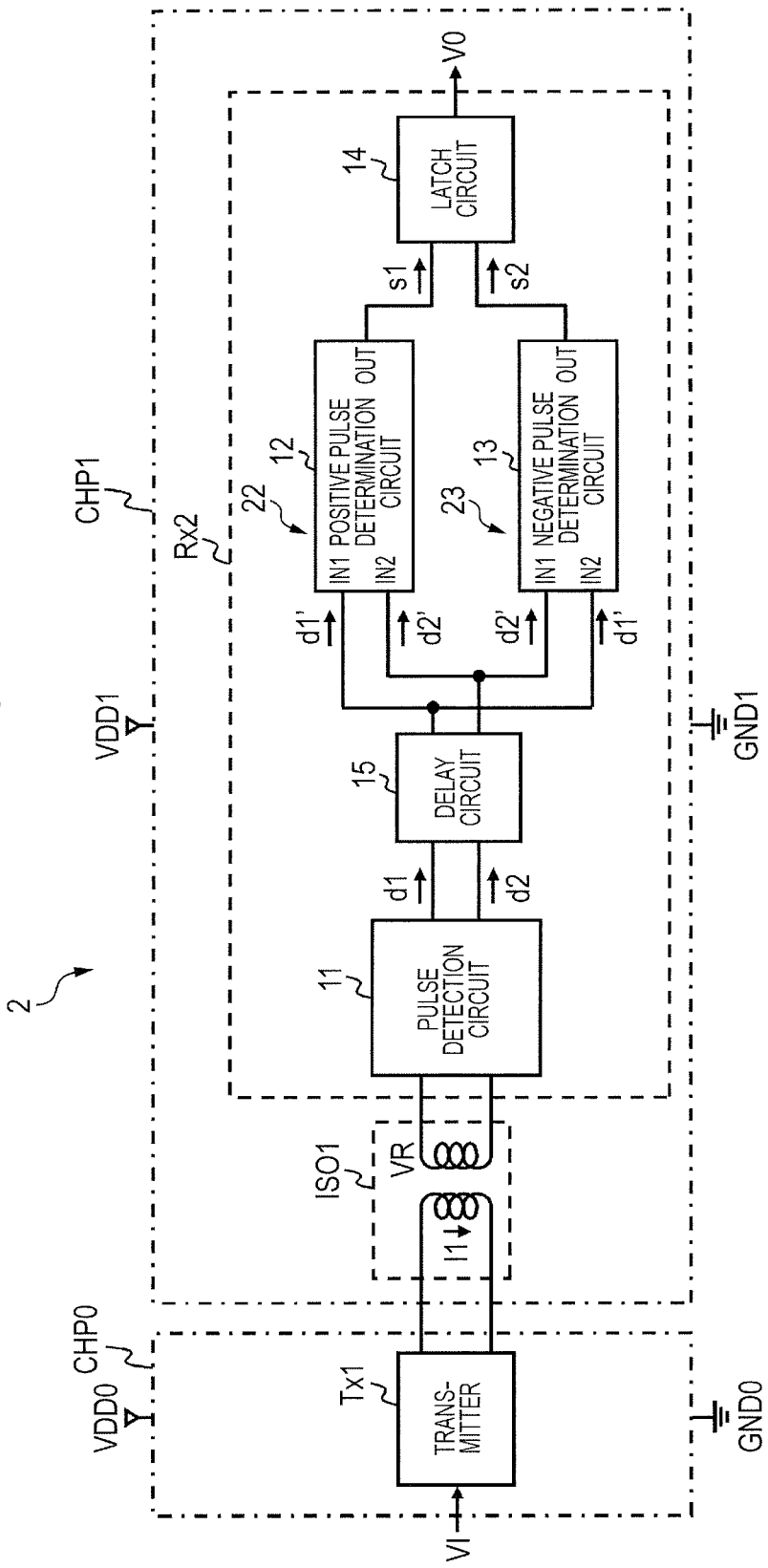
FIG. 8 is a block diagram illustrating a modification of the semiconductor integrated circuit according to the second embodiment.

The present embodiment will be described on the assumption that the receiver Rx2 includes two delay circuits 15, 16. However, the number of delay circuits is not limited to two. As shown in FIG. 8, the receiver Rx2 may include one delay circuit 15 that is to be shared.

The positive pulse determination circuit 12 outputs the determination result s1 in accordance with the detection results d1', d2' instead of the detection results d1, d2. More specifically, the positive pulse determination circuit 12 uses an input terminal IN1 to receive the supply of the detection result d1', uses an input terminal IN2 to receive the supply of the detection result d2', and uses an output terminal OUT to output the determination result s1. Hence, the positive pulse determination circuit 12 outputs the L-level (first logic value) determination result (first determination result) s1 during a period (first period) between the instant at which the detection result d2' is at the H level and the instant at which the detection results d1', d2' are both at the L level, and outputs the H-level (second logic value) determination result (first determination result) s1 if the detection result d1' is at the H level during the other period.

The negative pulse determination circuit 13 outputs the determination result in accordance with the detection results d1', d2' instead of the detection results d1, d2. More specifically, the negative pulse determination circuit 13 uses an input terminal IN1 to receive the supply of the detection result d2', uses an input terminal IN2 to receive the supply of the detection result d1', and uses an output terminal OUT to output the determination result s2. Hence, the negative pulse determination circuit 13 outputs the L-level (first logic value) determination result (second determination result) s2 during a period (second period) between the instant at which the detection result d1' is at the H level and the instant at which the detection results d1', d2' are both at the L level, and outputs the H-level (second logic value) determination result (second determination result) s2 if the detection result d2' is at the H level during the other period.

The circuit configuration of the other portion of the receiver Rx2 will not be described because it is the same as that of the receiver Rx1.

(State Transition Diagram of Positive Pulse Determination Section 22 and Negative Pulse Determination Section 23)

Figure 9:
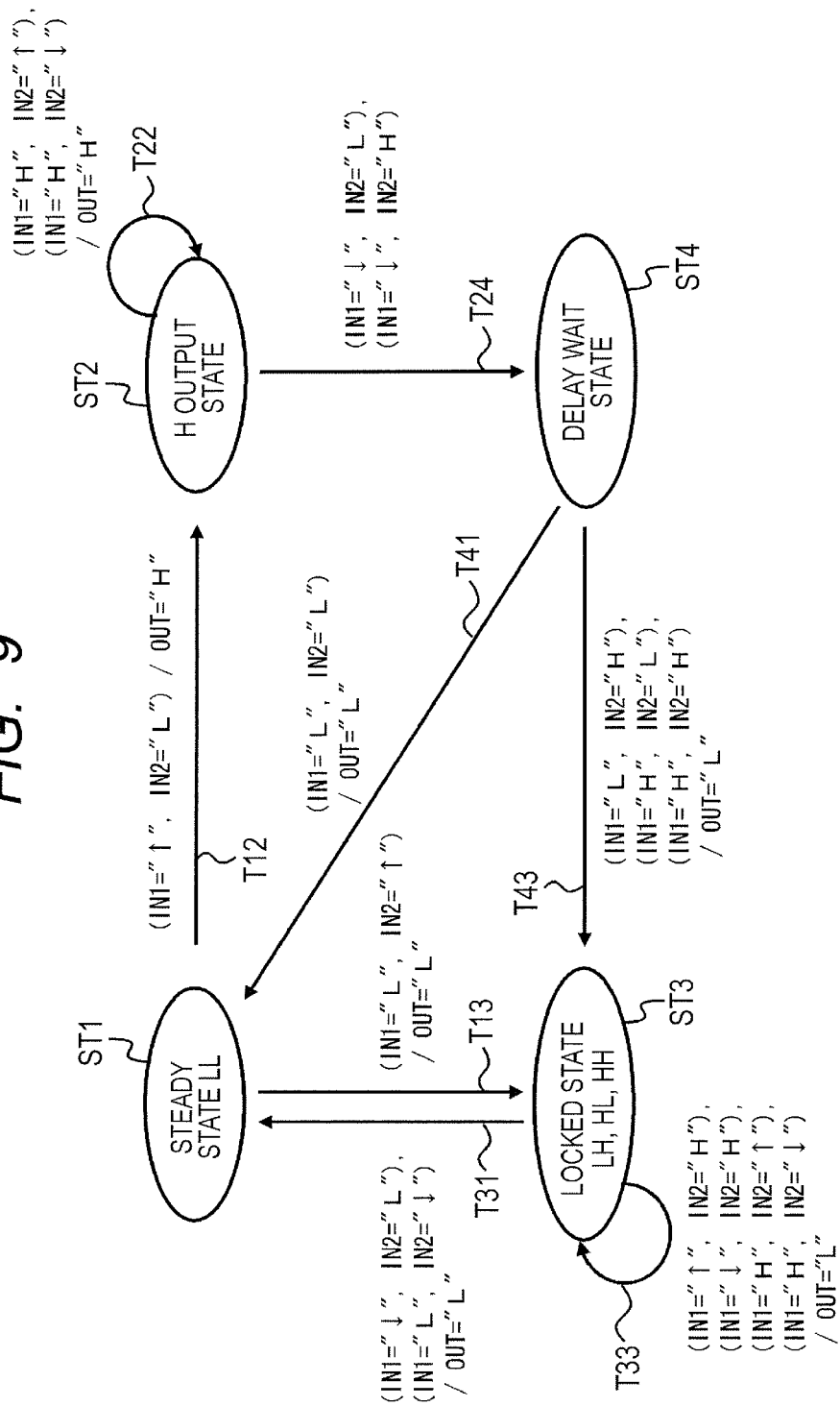
FIG. 9 is a state transition diagram illustrating the positive pulse determination circuit and negative pulse determination circuit according to the second embodiment.

A basic operation of the positive pulse determination section 22 will now be described with reference to FIG. 9. FIG. 9 is a state transition diagram of the positive pulse determination section 12 (negative pulse determination section 23). The symbols "IN1", "IN2", and "OUT" in FIG. 9 represent the input terminals and output terminal of the positive pulse determination section 22 (negative pulse determination section 23), respectively. Here, it is assumed that IN1=d1, and that IN2=d2, and further that OUT=s1. For the sake of simplification, it is also assumed that the delay circuit 15 outputs the detection results d1', d2' by delaying only the falls of the detection results d1, d2.

First of all, in the steady state (ST1), the positive pulse determination section 22 outputs the L-level determination result s1 in accordance with the L-level detection results d1, d2.

If, for instance, the detection result d1 rises in the steady state, the positive pulse determination section 22 outputs the H-level determination result s1 (T12). The positive pulse determination section 22 then transitions from the steady state (ST1) to the H output state (ST2).

Meanwhile, if the detection result d2 rises in the steady state, the positive pulse determination section 22 continuously outputs the L-level determination result s1 (T13). The positive pulse determination section 22 then transitions from the steady state (ST1) to the locked state (ST3).

Next, if the detection result d1 remains at the H level in the H output state, the positive pulse determination section 22 continuously outputs the H-level determination result s1 (T22) no matter whether the detection result d2 rises or falls. In this instance, the positive pulse determination section 22 remains in the H output state (ST2).

Meanwhile, if, in the H output state, the detection result d1 falls, the positive pulse determination section 22 transitions from the H output state (ST2) to a delay wait state (ST4).

When a predetermined delay time elapses after the fall of the detection result d1, the positive pulse determination section 22 transitions from the delay wait state (ST4) to another state.

If, for instance, the detection results d1, d2 are both at the L level, the detection results d1', d2' are both at the L level accordingly. Thus, the positive pulse determination section 22 outputs the L-level determination result s1 (T41). The positive pulse determination section 22 then transitions from the delay wait state (ST4) to the steady state (ST1).

Meanwhile, if either the detection result d1 or the detection result d2 is at the H level, either the detection result d1' or the detection result d2' is at the H level accordingly. Thus, the positive pulse determination section 22 outputs the L-level determination result s1 (T43). The positive pulse determination section 22 then transitions from the delay wait state (ST4) to the locked state (ST3).

Next, if one of the detection results d1, d2 is at the H level in the locked state, one of the detection results d1', d2' is at the H level accordingly. Thus, the positive pulse determination section 22 continuously outputs the L-level determination result s1 without regard to the transition of the other one of the detection results d1, d2 (d1', d2') (T33). In this instance, the positive pulse determination section 22 remains in the locked state (ST3).

Meanwhile, if, in the locked state, one of the detection results d1, d2 (d1', d2') is at the L level and the other one of the detection results d1, d2 falls, the other one of the detection results d1', d2' falls accordingly. Thus, the positive pulse determination section 22 continuously outputs the L-level determination result s1 (T31). The positive pulse determination section 22 then transitions from the locked state (ST3) to the steady state (ST1).

A basic operation of the negative pulse determination section 23 will now be described with reference to FIG. 9. Here, it is assumed that IN1=d2, and that IN2=d1, and further that OUT=s2.

First of all, in the steady state (ST1), the negative pulse determination section 23 outputs the L-level determination result s2 in accordance with the L-level detection results d1, d2.

If the detection result d2 rises in the steady state, the negative pulse determination section 23 outputs the H-level determination result s2 (T12). The negative pulse determination section 23 then transitions from the steady state (ST1) to the H output state (ST2).

Meanwhile, if the detection result d1 rises in the steady state, the negative pulse determination section 23 continuously outputs the L-level determination result s2 (T13). The negative pulse determination section 23 then transitions from the steady state (ST1) to the locked state (ST3).

Next, if the detection result d2 remains at the H level, the negative pulse determination section 23 continuously outputs the H-level determination result s2 no matter whether the detection result d1 rises or falls (T22). In this instance, the negative pulse determination section 23 remains in the H output state (ST2).

Meanwhile, if the detection result d2 falls in the H output state, the negative pulse determination section 23 transitions from the H output state (ST2) to the delay wait state (ST4).

When a predetermined delay time elapses after the fall of the detection result d2, the negative pulse determination section 23 transitions from the delay wait state (ST4) to another state.

If, for instance, the detection results d1, d2 are both at the L level, the detection results d1', d2' are both at the L level accordingly. Thus, the negative pulse determination section 23 outputs the L-level determination result s2 (T41). The negative pulse determination section 23 then transitions from the delay wait state (ST4) to the steady state (ST1).

Meanwhile, if either the detection result d1 or the detection result d2 is at the H level, either the detection result d1' or the detection result d2' is at the H level accordingly. Thus, the negative pulse determination section 23 outputs the L-level determination result s2 (T43). The negative pulse determination section 23 then transitions from the delay wait state (ST4) to the locked state (ST3).

Next, if one of the detection results d1, d2 is at the H level in the locked state, one of the detection results d1', d2' is at the H level accordingly. Thus, the negative pulse determination section 23 continuously outputs the L-level determination result s2 without regard to the transition of the other one of the detection results d1, d2 (d1', d2') (T33). In this instance, the negative pulse determination section 23 remains in the locked state (ST3).

Meanwhile, if, in the locked state, one of the detection results d1, d2 (d1', d2') is at the L level and the other one of the detection results d1, d2 falls, the other one of the detection results d1', d2' falls accordingly. Thus, the negative pulse determination section 23 continuously outputs the L-level determination result s2 (T31). The negative pulse determination section 23 then transitions from the locked state (ST3) to the steady state (ST1).

(Timing Diagram)

An operation of the receiver Rx2 will now be described with reference to FIG. 10A. FIG. 10A is a timing diagram illustrating an exemplary operation of the receiver Rx2. The operation depicted in FIG. 10A can be performed not only when a transformer is used as the AC-coupling element ISO1, but also when, for instance, a capacitor or a GMR element is used as the AC-coupling element ISO1.

In the initial state (time t0), the transmission data VIN is at the L level. Hence, the transmitter Tx1 does not cause the current I1 to flow to the primary coil L11 (I1=approximately 0 A). Therefore, the reception signal VR remains at a reference voltage. The pulse detection circuit 11 does not detect a pulse signal having a positive amplitude or a pulse signal having a negative amplitude. Thus, the pulse detection circuit 11 outputs the L-level detection results d1, d2 in these cases. Hence, the positive pulse determination section 22 outputs the L-level determination result s1, whereas the negative pulse determination section 23 outputs the L-level determination result s2. In other words, the positive pulse determination section 22 and the negative pulse determination section 23 are both in the steady state (ST1). Consequently, the latch circuit 14 outputs L-level output data VO.

When the transmission data VIN transitions from the L level to the H level (time t1), the transmitter Tx1 outputs a pulse signal (transmission signal) having a positive amplitude by causing the current I1 to flow temporarily from one end of the primary coil L11 to the other end (time t1 to time t6). Hence, a positive electromotive force (a pulse signal having a positive amplitude) corresponding to an electrical current change in the primary coil L11 is generated in the secondary coil L12 as the reception signal VR (A in FIG. 10A) (time t1 to time t2). If, in this instance, the current I1 flowing from one end of the primary coil L11 to the other end is blocked, a negative electromotive force (a counter pulse having a negative amplitude) corresponding to an electrical current change in the primary coil is also generated in the secondary coil L12 as the reception signal VR (B in FIG. 10A) (time t2 to time t6).

While the pulse signal having a positive amplitude is not lower than the threshold voltage Vth+, the pulse detection circuit 11 outputs the H-level detection result d1 (time t1 to time t2). Further, while the counter pulse having a negative amplitude is not higher than the threshold voltage Vth−, the pulse detection circuit 11 outputs the H-level detection result d2 (time t3 to time t5). Although the counter pulse having a negative amplitude is not always equal to or lower than the threshold voltage Vth−, the example shown in FIG. 10A is described on the assumption that the counter pulse having a negative amplitude is unintentionally equal to or lower than the threshold voltage Vth−.

A period (time t2 to time t3) during which the detection results d1, d2 are both at the L level exists between a period (time t1 to time t2) during which the detection result d1 is at the H level due to a pulse signal having a positive amplitude (A in FIG. 10A) and a period (time t3 to time t5) during which the detection result d2 is at the H level due to a counter pulse having a negative amplitude (B in FIG. 10A).

In the receiver Rx1 shown in FIG. 1, for example, the positive pulse determination circuit 12 (equivalent to the positive pulse determination section) and the negative pulse determination circuit 13 (equivalent to the negative pulse determination section) revert to the steady state (ST1) during the above-mentioned period (time t2 to time t3). Hence, the receiver Rx1 shown in FIG. 1 may erroneously acquire the counter pulse having a negative amplitude (B in FIG. 10A) as a normal pulse signal indicative of the fall of the transmission data VIN.

In the receiver Rx2 shown in FIG. 7, therefore, the positive pulse determination circuit 12 outputs the determination result s1 in accordance with the detection results d1', d2', which are obtained by delaying the falls of the detection results d1, d2. Similarly, the negative pulse determination circuit 13 outputs the determination result s2 in accordance with the detection results d1', d2', which are obtained by delaying the falls of the detection results d1, d2. Hence, the receiver Rx2 prevents the counter pulse having a negative amplitude from being erroneously acquired as a normal pulse signal. Details are given below.

In the positive pulse determination section 22, the delay circuit 15 causes the detection result d1' to rise (time t1) immediately after the rise of the detection result d1 (time t1) and causes the detection result d1' to fall (time t4) when a predetermined delay time elapses after the fall of the detection result d1 (time t2). Further, the delay circuit 15 causes the detection result d2' to rise (time t3) immediately after the rise of the detection result d2 (time t3) and causes the detection result d2' to fall (time t7) when a predetermined delay time elapses after the fall of the detection result d2 (time t5).

In the positive pulse determination section 22, the positive pulse determination circuit 12 outputs the H-level determination result s1 (time t1 to time t3) during an interval between the instant at which at least the detection result d1 rises and the instant at which the detection result d1 is at the H level, and continuously outputs the L-level determination result s1 (time t3 to time t7) during an interval between the instant at which at least the detection result d2 (d2') rises and the instant at which the detection results d1', d2' are both at the L level.

More specifically, the positive pulse determination section 22 operates in accordance with the transition diagram of FIG. 9.

First of all, the positive pulse determination section 22 outputs the H-level determination result s1 (time t1) when the detection result d1 supplied to the input terminal IN1 rises. The positive pulse determination section 22 then transitions from the steady state (ST1) to the H output state (ST2).

Next, the positive pulse determination section 22 transitions from the H output state (ST2) to the delay wait state (ST4) (time t2) when the detection result d1 falls. When the detection result d2 supplied to the input terminal IN2 rises in the delay wait state, the positive pulse determination section 22 outputs the detection result s1 (time t3) after changing its level from H to L.

Next, when a predetermined delay time elapses after the fall of the detection result d1, the positive pulse determination section 22 transitions from the delay wait state (ST4) to the locked state (ST3) (time t4). It should be noted that the positive pulse determination section 22 continuously outputs the L-level determination result s1.

Next, when the detection result d2' falls in accordance with the fall of the detection result d2, the positive pulse determination section 22 continuously outputs the L-level determination result s1 (time t7). The positive pulse determination section 22 then transitions from the locked state (ST3) to the steady state (ST1).

Meanwhile, in the negative pulse determination section 23, the delay circuit 16 causes the detection result d1' to rise (time t1) immediately after the rise of the detection result d1 (time t1) and causes the detection result d1' to fall (time t4) when a predetermined delay time elapses after the fall of the detection result d1 (time t2). Further, the delay circuit 16 causes the detection result d2' to rise (time t3) immediately after the rise of the detection result d2 (time t3) and causes the detection result d2' to fall (time t7) when a predetermined delay time elapses after the fall of the detection result d2 (time t5).

In the negative pulse determination section 23, the negative pulse determination circuit 13 continuously outputs the L-level determination result s2 (time t1 to time t7) during an interval between the instant at which the detection result d1 (d1') rises and the instant at which the detection results d1', d2' are both at the L level.

More specifically, the negative pulse determination section 23 also operates in accordance with the transition diagram of FIG. 9.

First of all, the negative pulse determination section 23 outputs the L-level determination result s2 (time t1) when the detection result d1 supplied to the input terminal IN2 rises. The negative pulse determination section 23 then transitions from the steady state (ST1) to the locked state (ST3).

Next, the negative pulse determination section 23 continuously outputs the L-level determination result s2 (time t4) because the detection result d2 (d2') supplied to the input terminal IN1 has risen and is at the H level although the detection result d1' falls in accordance with the fall of the detection result d1. In this instance, the negative pulse determination section 23 remains in the locked state (ST3).

Next, when the detection result d2' falls in accordance with the fall of the detection result d2, the negative pulse determination section 23 continuously outputs the L-level determination result s2 (time t7). The negative pulse determination section 23 then transitions from the locked state (ST3) to the steady state (ST1).

Subsequently, when the transmission data VIN transitions from the H level to the L level (time t8), the transmitter Tx1 outputs a pulse signal (transmission signal) having a negative amplitude (time t8 to time t13) by causing a current to flow temporarily from the other end of the primary coil L11 to the one end. Hence, a negative electromotive force (a pulse signal having a negative amplitude) corresponding to an electrical current change in the primary coil L11 is generated in the secondary coil L12 as the reception signal VR (C in FIG. 10A) (time t8 to time t9). If, in this instance, the current I1 flowing from the other end of the primary coil L11 to the one end is blocked, a positive electromotive force (a counter pulse having a positive amplitude) corresponding to an electrical current change in the primary coil is also generated in the secondary coil L12 as the reception signal VR (D in FIG. 10A) (time t9 to time t13).

While the pulse signal having a negative amplitude is not higher than the threshold voltage Vth−, the pulse detection circuit 11 outputs the H-level detection result d2 (time t8 to time t9). Further, while the counter pulse having a positive amplitude is not lower than the threshold voltage Vth+, the pulse detection circuit 11 outputs the H-level detection result d1 (time t10 to time t12). Although the counter pulse having a positive amplitude is not always equal to or higher than the threshold voltage Vth+, the example shown in FIG. 10A is described on the assumption that the counter pulse having a positive amplitude is unintentionally equal to or higher than the threshold voltage Vth+.

A period (time t9 to time t10) during which the detection results d1, d2 are both at the L level exists between a period (time t8 to time t9) during which the detection result d2 is at the H level due to a pulse signal having a negative amplitude (C in FIG. 10A) and a period (time t10 to time t12) during which the detection result d2 is at the H level due to a counter pulse having a positive amplitude (D in FIG. 10A).

In the receiver Rx1 shown in FIG. 1, for example, the positive pulse determination circuit 12 (equivalent to the positive pulse determination section) and the negative pulse determination circuit 13 (equivalent to the negative pulse determination section) revert to the steady state (ST1) during the above-mentioned period (time t9 to time t10). Hence, the receiver Rx1 shown in FIG. 1 may erroneously acquire the counter pulse having a positive amplitude (D in FIG. 10A) as a normal pulse signal indicative of the rise of the transmission data VIN.

In the receiver Rx2 shown in FIG. 7, therefore, the positive pulse determination circuit 12 outputs the determination result s1 in accordance with the detection results d1', d2', which are obtained by delaying the falls of the detection results d1, d2. Similarly, the negative pulse determination circuit 13 outputs the determination result s2 in accordance with the detection results d1', d2', which are obtained by delaying the falls of the detection results d1, d2. Hence, the receiver Rx2 prevents the counter pulse having a positive amplitude from being erroneously acquired as a normal pulse signal. Details are given below.

In the positive pulse determination section 22, the delay circuit 15 causes the detection result d2' to rise (time t8) immediately after the rise of the detection result d2 (time t8) and causes the detection result d2' to fall (time t11) when a predetermined delay time elapses after the fall of the detection result d2 (time t9). Further, the delay circuit 15 causes the detection result d1' to rise (time t10) immediately after the rise of the detection result d1 (time t10) and causes the detection result d1' to fall (time t14) when a predetermined delay time elapses after the fall of the detection result d1 (time t12).

In the positive pulse determination section 22, the positive pulse determination circuit 12 continuously outputs the L-level determination result s1 (time t8 to time t14) during an interval between the instant at which the detection result d2 (d2') rises and the instant at which the detection results d1', d2' are both at the L level.

In reality, the positive pulse determination section 22 operates in accordance with the state transition diagram of FIG. 9. The operation performed by the positive pulse determination section 22 between time t8 and time t14 will not be described because it is the same as the operation performed by the negative pulse determination section 23 between time t1 and time t7. However, the "detection result d1", "detection result d2", "detection result d1'", and "detection result d2'" should be read as the "detection result d2", "detection result d1", "detection result d2'", and "detection result d1'", respectively, and the "determination result s2" should be read as the "determination result s1".

Meanwhile, in the negative pulse determination section 23, the delay circuit 16 causes the detection result d2' to rise (time t8) immediately after the rise of the detection result d2 (time t8) and causes the detection result d2' to fall (time t11) when a predetermined delay time elapses after the fall of the detection result d2 (time t9). Further, the delay circuit 16 causes the detection result d1' to rise (time t10) immediately after the rise of the detection result d1 (time t10) and causes the detection result d1' to fall (time t14) when a predetermined delay time elapses after the fall of the detection result d1 (time t12).

In the negative pulse determination section 23, the negative pulse determination circuit 13 outputs the H-level determination result s2 (time t8 to time t10) during an interval between the instant at which at least the detection result d2 rises and the instant at which the detection result d2 is at the H level, and continuously outputs the L-level determination result s2 (time t10 to time t14) during an interval between the instant at which the detection result d1 (d1') rises and the instant at which the detection results d1', d2' are both at the L level.

In reality, the negative pulse determination section 23 operates in accordance with the state transition diagram of FIG. 9. The operation performed by the negative pulse determination section 23 between time t8 and time t14 will not be described because it is the same as the operation performed by the positive pulse determination section 22 between time t1 and time t7. However, the "detection result d1", "detection result d2", "detection result d1'", and "detection result d2'" should be read as the "detection result d2", "detection result d1", "detection result d2'", and "detection result d1'", respectively, and the "determination result s1" should be read as the "determination result s2".

The latch circuit 14 causes the output data VO to rise in synchronism with the rise of the determination result s1 (time t1), and causes the output data VO to fall in synchronism with the rise of the determination result s2 (time t4).

As described above, in the receiver Rx2, the positive pulse determination circuit 12 and the negative pulse determination circuit 13 output the determination results s1, s2, respectively, in accordance with the detection results d1', d2', which are obtained by delaying the falls of the detection results d1, d2. A period during which the detection results d1', d2' are both at the L level does not exist between a period during which the detection result d1' (or d2') is at the H level due to a normal pulse signal and a period during which the detection result d2' (d1') is at the H level due to a counter pulse. Consequently, the receiver Rx2 can accurately receive (reproduce) data because it can compensate for any time lag between the instant at which a normal pulse signal is detected and the instant at which a counter pulse is detected.

Referring to FIG. 10A, the period (first period) between the instant at which the detection result d2' is at the H level and the instant at which the detection results d1', d2' are both at the L level is a period between time t8 and time t14 and a period between time t3 and time t7. The period (second period) between the instant at which the detection result d1' is at the H level and the instant at which the detection results d1', d2' are both at the L level is a period between time t1 and time t7 and a period between time t10 and time t14.

FIG. 10A is used to describe a case where a counter pulse having a negative amplitude is detected (time t3 to time t5) and a counter pulse having a positive amplitude is detected (time t10 to time t12). However, the counter pulse having a negative or positive amplitude may not be detected depending, for instance, on the settings of the threshold voltages Vth+, Vth− and on the operating conditions (temperature and power supply voltage). Even in such a case, it is natural that the receiver Rx2 can accurately receive data.

FIG. 10B is a timing diagram illustrating another operation of the receiver Rx2. The timing diagram of FIG. 10B differs from the timing diagram of FIG. 10A in that no counter pulse is detected. FIG. 10B also indicates that the receiver Rx2 receives (reproduces) data with high accuracy. The other operation depicted in the timing diagram of FIG. 10B will not be described because it is the same as depicted in FIG. 10A.
(First Exemplary Detailed Configuration of Delay Circuits 15, 16)

A first exemplary detailed configuration of the delay circuits 15, 16 will now be described. The delay circuit 15 will be representatively described below because the delay circuits 15, 16 have the same circuit configuration.

Figure 11:
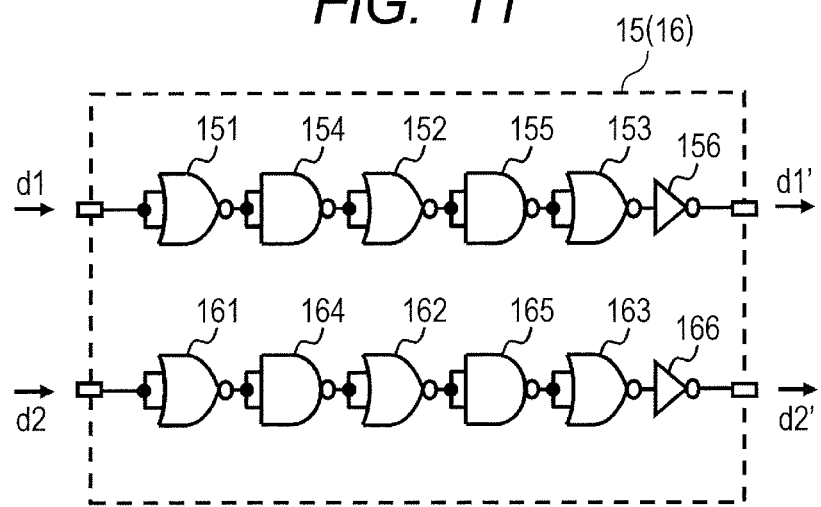
FIG. 11 is a diagram illustrating an exemplary detailed configuration of a delay circuit according to the second embodiment.

FIG. 11 is a diagram illustrating an exemplary detailed configuration of the delay circuit 15. The delay circuit 15 shown in FIG. 11 includes negative OR circuits (hereinafter simply referred to as the NOR circuits) 151 to 153, 161 to 163, negative AND circuits (hereinafter simply referred to as the NAND circuits) 154, 155, 164, 165, and inverter circuits (hereinafter simply referred to as the INV circuits) 156, 166.

The NOR circuit 151 outputs the negative OR of the detection result d1. The NAND circuit 154 outputs the negative AND of the output of the NOR circuit 151. The NOR circuit 152 outputs the negative OR of the output of the NAND circuit 154. The NAND circuit 155 outputs the negative AND of the output of the NOR circuit 152. The NOR circuit 153 outputs the negative OR of the output of the NAND circuit 155. The INV circuit 156 outputs an inverted signal of the output of the NOR circuit 153 as the detection result d1'.

The NOR circuit 161 outputs the negative OR of the detection result d2. The NAND circuit 164 outputs the negative AND of the output of the NOR circuit 161. The NOR circuit 162 outputs the negative OR of the output of the NAND circuit 164. The NAND circuit 165 outputs the negative AND of the output of the NOR circuit 162. The NOR circuit 163 outputs the negative OR of the output of the NAND circuit 165. The INV circuit 166 outputs an inverted signal of the output of the NOR circuit 163 as the detection result d2'.

As the delay circuit 15 shown in FIG. 11 has the above-described circuit configuration, it outputs the detection results d1', d2' by significantly delaying the falls of the detection results d1, d2 from their rises.
(Second Exemplary Detailed Configuration of Delay Circuits 15, 16)

A second exemplary detailed configuration of the delay circuits 15, 16 will now be described. The delay circuit 15 will be representatively described below because the delay circuits 15, 16 have the same circuit configuration.

Figure 12:
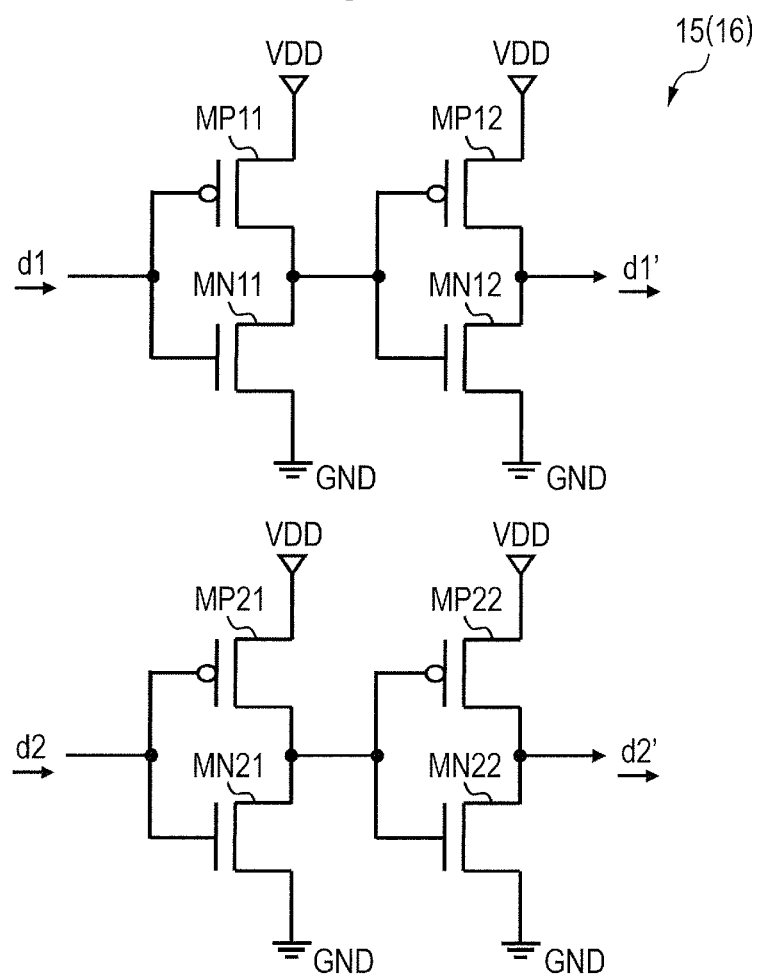
FIG. 12 is a diagram illustrating an exemplary detailed configuration of the delay circuit according to the second embodiment.

FIG. 12 is a diagram illustrating an exemplary detailed configuration of the delay circuit 15. The delay circuit 15 shown in FIG. 12 includes P-channel MOS transistors (hereinafter simply referred to as the transistors) MP11, MP12, MP21, MP22 and N-channel MOS transistors (hereinafter simply referred to as the transistors) MN11, MN12, MN21, MN22. The on-resistances of the transistors MP11, MP21, MN12, MN22 are respectively higher than those of the transistors MN11, MN21, MP12, MP22.

The transistors MP11, MN11 form a first inverter. The transistors MP12, MN12 form a second inverter. The first inverter outputs an inverted signal of the detection result d1. The second inverter outputs an inverted signal of the output of the first inverter as the detection result d1'.

The transistors MP21, MN21 form a third inverter. The transistors MP22, MN22 form a fourth inverter. The third inverter outputs an inverted signal of the detection result d2. The fourth inverter outputs an inverted signal of the output of the third inverter as the detection result d2'.

In the delay circuit 15 shown in FIG. 12, when the detection result d1 rises, the transistors MN11, MP12 having a low on-resistance turn on and the transistors MP11, MN12 having a high on-resistance turn off. Therefore, the detection result d1' rises at a relatively early timing. Similarly, in the delay circuit 15 shown in FIG. 12, when the detection result d2 rises, the transistors MN21, MP22 having a low on-resistance turn on and the transistors MP21, MN22 having a high on-resistance turn off. Therefore, the detection result d2' rises at a relatively early timing.

Meanwhile, in the delay circuit 15 shown in FIG. 12, when the detection result d1 rises, the transistors MP11, MN12 having a high on-resistance turn on and the transistors MN11, MP12 having a low on-resistance turn off. Therefore, the detection result d1' rises at a relatively late timing. Similarly, in the delay circuit 15 shown in FIG. 12, when the detection result d2 rises, the transistors MP21, MN22 having a high on-resistance turn on and the transistors MN21, MP22 having a low on-resistance turn off. Therefore, the detection result d2' rises at a relatively late timing.

As the delay circuit 15 shown in FIG. 12 has the above-described circuit configuration, it outputs the detection results d1', d2' by significantly delaying the falls of the detection results d1, d2 from their rises.

Figure 13:
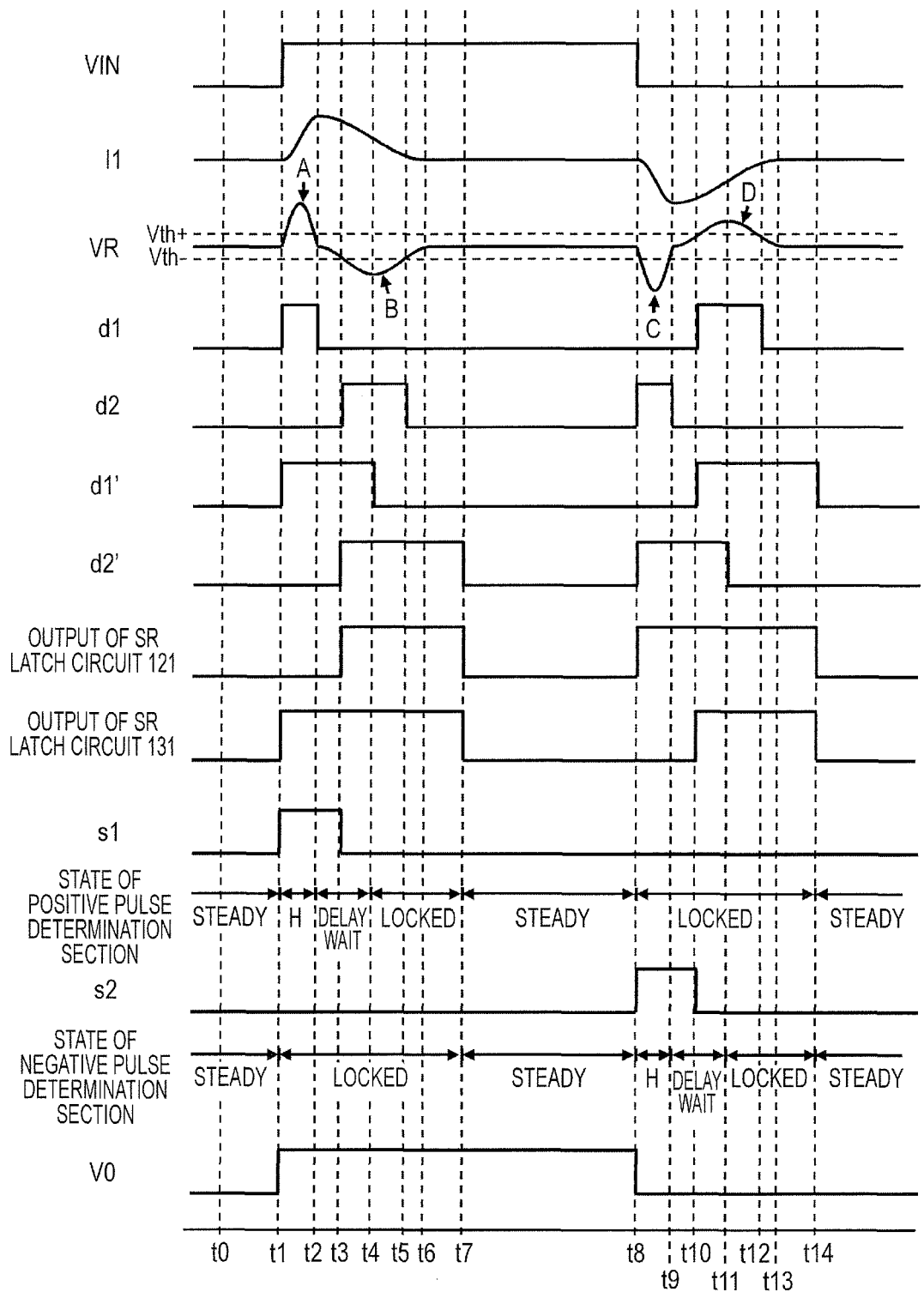
FIG. 13 is a timing diagram illustrating an operation of the receiver according to the second embodiment.

FIG. 13 is a timing diagram illustrating an operation that is performed by the receiver Rx2 when the positive pulse determination circuit 12 and the negative pulse determination circuit 13 are configured as shown in FIG. 5. In the timing diagram of FIG. 13, the output signal of each SR latch circuit 121, 131 is also depicted. The other portion of FIG. 13 will not be described because it is the same as depicted in FIG. 10A.

As described above, the receiver Rx2 according to the present embodiment provides the same advantages as the receiver according to the first embodiment. Further, in the receiver Rx2 according to the present embodiment, the positive pulse determination circuit 12 and the negative pulse determination circuit 13 output the determination results s1, s2, respectively, in accordance with the detection results d1', d2', which are obtained by delaying the falls of the detection results d1, d2. Hence, the receiver Rx2 can accurately receive (reproduce) data because it can compensate for any time lag between the instant at which a normal pulse signal is detected and the instant at which a counter pulse is detected.

Further, even when a plurality of noise components (including a counter pulse) are detected with a time lag after the detection of a normal pulse signal, the receiver Rx2 according to the present embodiment can accurately receive data because it can compensate for the time lag by delaying the falls of the detection results d1, d2, which are caused by the noise components.

Third Embodiment

Figure 14:
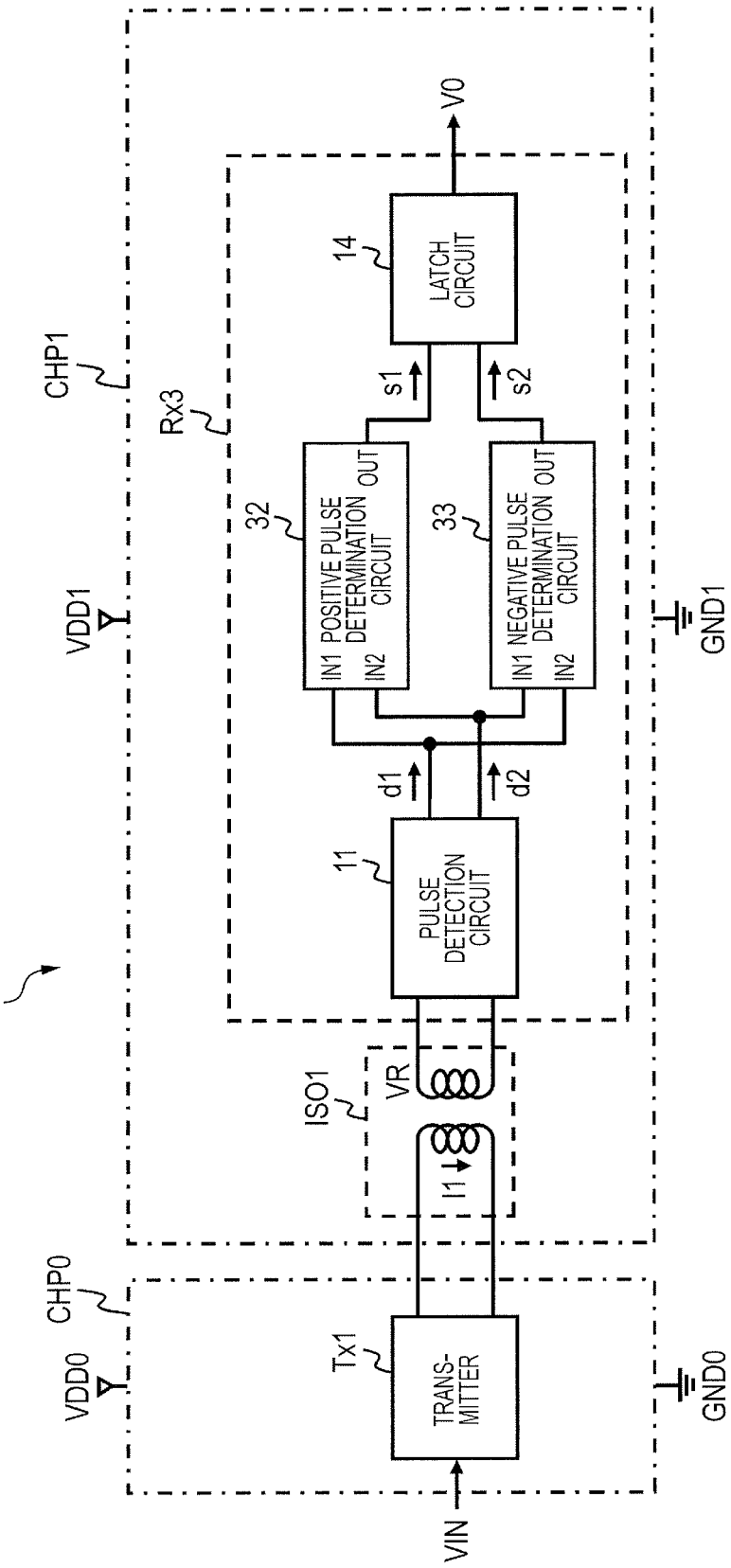
FIG. 14 is a block diagram illustrating the semiconductor integrated circuit according to a third embodiment of the present invention.

FIG. 14 is a block diagram illustrating an exemplary configuration of a semiconductor integrated circuit 3 that includes a receiver Rx3 according to a third embodiment of the present invention to form an isolator. The third embodiment will now be described in detail.

The semiconductor integrated circuit 3 shown in FIG. 14 differs from the semiconductor integrated circuit 1 shown in FIG. 1 in that the former includes the receiver Rx3 in place of the receiver Rx1. The circuit configuration of the other portion of the semiconductor integrated circuit 3 shown in FIG. 14 will not be described because it is the same as that of the semiconductor integrated circuit 1 shown in FIG. 1.

The receiver Rx3 differs from the receiver Rx1 in that the former includes a positive pulse determination circuit 32 in place of the positive pulse determination circuit 12 and a negative pulse determination circuit 33 in place of the negative pulse determination circuit 13.

The positive pulse determination circuit 32 determines a pulse signal having a positive amplitude that is detected by the pulse detection circuit 11. The positive pulse determination circuit 32 does not determine the pulse signal having a positive amplitude as a normal pulse signal until a predetermined period elapses after the detection of a pulse signal having a negative amplitude. More specifically, the positive pulse determination circuit 32 outputs the L-level (first logic value) determination result (first determination result) s1 during a predetermined period after the detection result d2 is at the H level, and outputs the H-level (second logic value) determination result (first determination result) s1 if the detection result d1 is at the H level during the other period.

The negative pulse determination circuit 33 determines a pulse signal having a negative amplitude that is detected by the pulse detection circuit 11. The negative pulse determination circuit 33 does not determine the pulse signal having a negative amplitude as a normal pulse signal until a predetermined period elapses after the detection of a pulse signal having a positive amplitude. More specifically, the negative pulse determination circuit 33 outputs the L-level (first logic value) determination result (second determination result) s2 during a predetermined period after the detection result d1 is at the H level, and outputs the H-level (second logic value) determination result (second determination result) s2 if the detection result d2 is at the H level during the other period.

Figure 15:
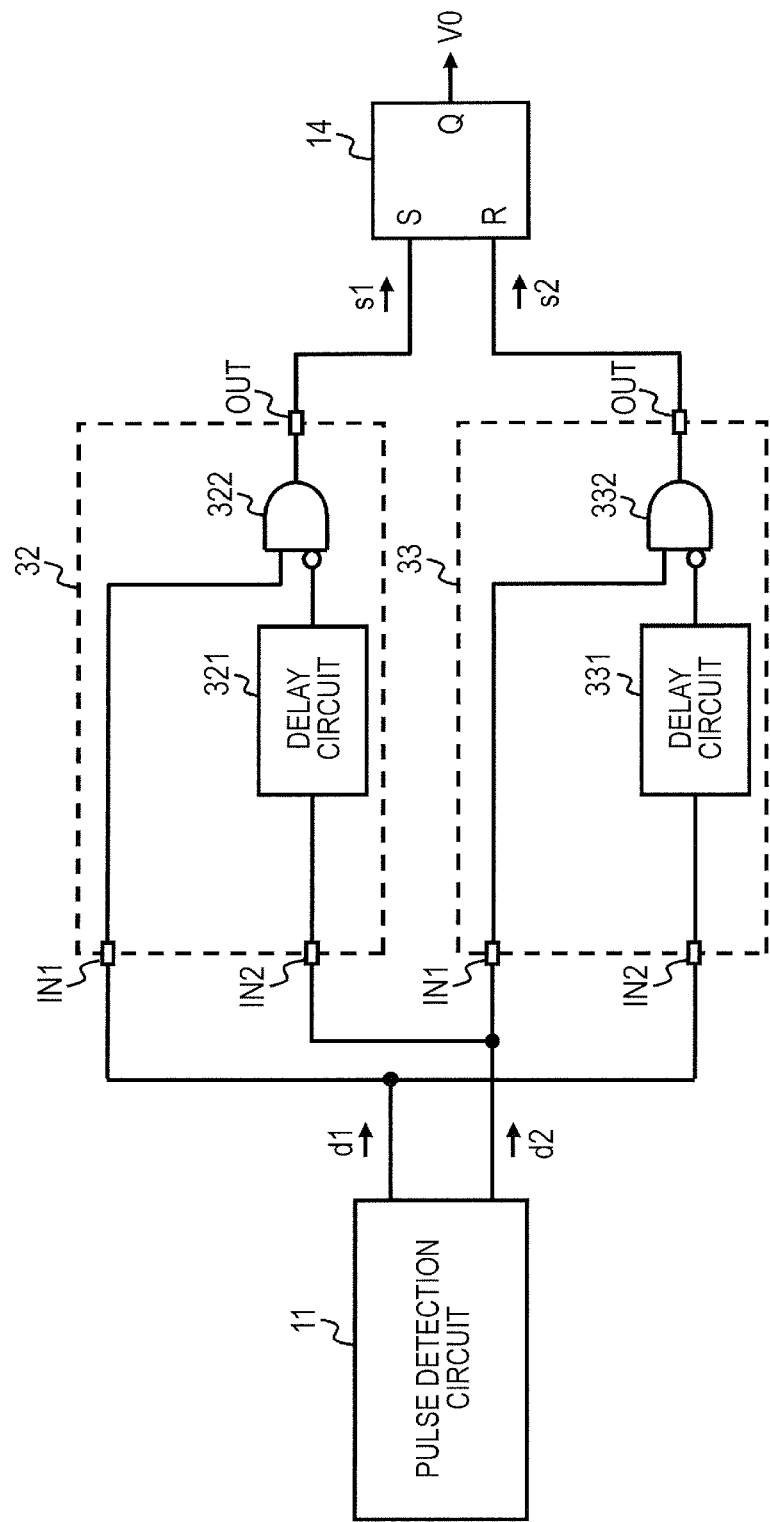
FIG. 15 is a diagram illustrating an exemplary detailed configuration of the positive pulse determination circuit and negative pulse determination circuit according to the third embodiment.

FIG. 15 is a diagram illustrating an exemplary detailed configuration of the positive pulse determination circuit 32 and negative pulse determination circuit 33. Referring to FIG. 15, the positive pulse determination circuit 32 includes a delay circuit (first delay circuit) 321 and an AND circuit 322. The delay circuit 321 outputs the fall of an input signal by significantly delaying it from its rise. The negative pulse determination circuit 33 includes a delay circuit (second delay circuit) 331 and an AND circuit 332. The delay circuit 331 outputs the fall of an input signal by significantly delaying it from its rise.

The delay circuit 321 outputs the detection result d2' by significantly delaying the fall of the detection result d2 of the pulse detection circuit 11 from its rise. The delay circuit 321 is formed by using a path that is included in the configuration of the delay circuit 15 (16) shown, for instance, in FIGS. 11 and 12. The AND circuit 322 outputs the logical AND of the detection result d1 of the pulse detection circuit 11 and an inverted signal of the detection result d2' as the determination result s1. Hence, the positive pulse determination circuit 32 masks the detection result d1 during the rise of the detection result d2'.

The delay circuit 331 outputs the detection result d1' by significantly delaying the fall of the detection result d1 of the pulse detection circuit 11 from its rise. The delay circuit 331 is formed by using a path that is included in the configuration of the delay circuit 15 (16) shown, for instance, in FIGS. 11 and 12. The AND circuit 332 outputs the logical AND of the detection result d2 of the pulse detection circuit 11 and an inverted signal of the detection result d1' as the determination result s2. Hence, the negative pulse determination circuit 33 masks the detection result d2 during the rise of the detection result d1'.

The circuit configuration of the other portion of the receiver Rx3 will not be described because it is the same as that of the receiver Rx1.

(State Transition Diagram of Positive Pulse Determination Circuit 32 and Negative Pulse Determination Circuit 33)

Figure 16:
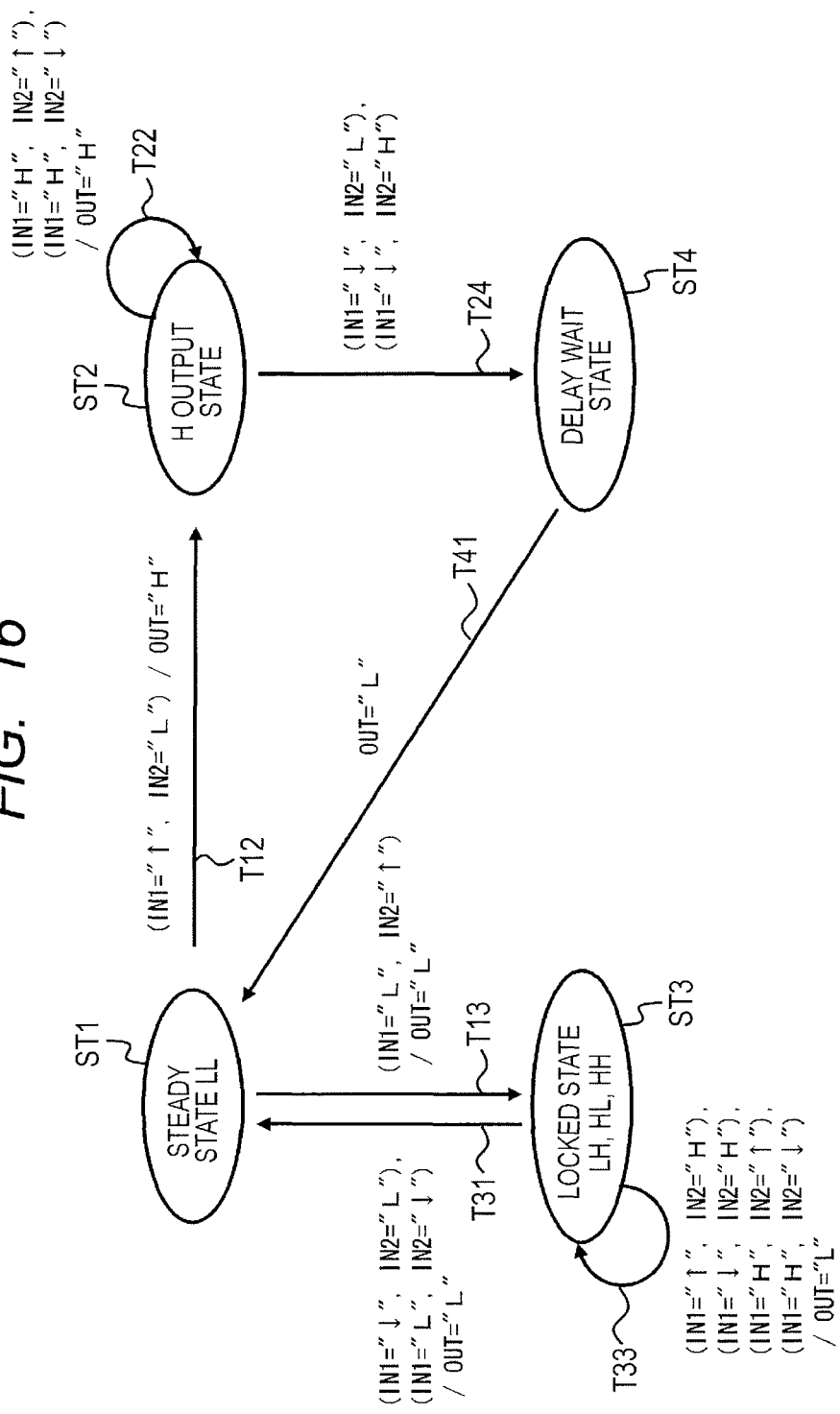
FIG. 16 is a state transition diagram illustrating the positive pulse determination circuit and negative pulse determination circuit according to the third embodiment.

FIG. 16 is a state transition diagram of the positive pulse determination circuit 32 (negative pulse determination circuit 33). The state transition diagram of FIG. 16 differs from the state transition diagram of FIG. 9 in that transition T43 is deleted. More specifically, the positive pulse determination circuit 32 constantly transitions from the delay wait state (ST4) to the steady state (ST1) without transitioning to the locked state. Similarly, the negative pulse determination circuit 33 constantly transitions from the delay wait state (ST4) to the steady state (ST1) without transitioning to the locked state. The other transitions shown in FIG. 16 will not be described because they are the same as depicted in FIG. 9.

As described above, the positive pulse determination circuit 32 and the negative pulse determination circuit 33 constantly transitions from the delay wait state to the steady state without transitioning to the locked state. Therefore, the delay wait state needs to persist for a sufficiently long period of time so as to eliminate noise components generated in the reception signal VR.

(Timing Diagram)

Figure 17A:
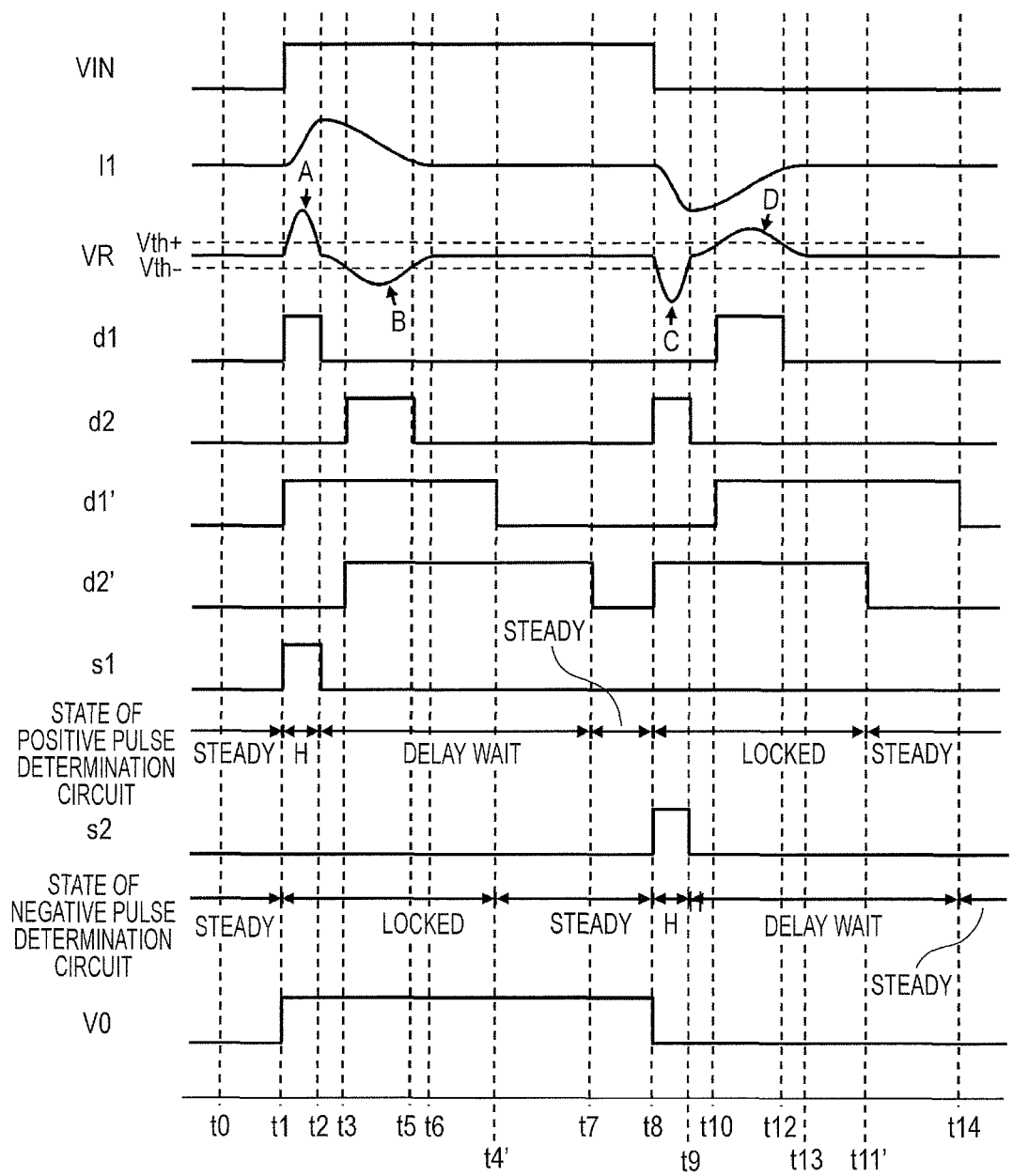
FIG. 17A is a timing diagram illustrating an operation of the receiver according to the third embodiment.

FIG. 17A is a timing diagram illustrating an operation of the receiver Rx3. The operation depicted in FIG. 17A can be performed not only when a transformer is used as the AC-coupling element ISO1, but also when, for instance, a capacitor or a GMR element is used as the AC-coupling element ISO1.

The timing diagram of FIG. 17A differs from the timing diagram of FIG. 10A in that the fall time (t4', t14) of the detection result d1' and the fall time (t7, t11') of the detection result d2' are later than indicated in the timing diagram of FIG. 10A. Further, the positive pulse determination circuit 32 masks the detection result d1 during the rise of the detection result d2'. Therefore, the positive pulse determination circuit 32 outputs the H-level determination result s1 only during the period between time t1 and time t2. Meanwhile, the negative pulse determination circuit 33 masks the detection result d2 during the rise of the detection result d1'. Therefore, the negative pulse determination circuit 33 outputs the H-level determination result s2 only during the period between time t8 and time t9. The other operation indicated in the timing diagram of FIG. 17A will not be described because it is basically the same as indicated in FIG. 10A.

Referring to FIG. 17A, the predetermined period after the detection result d2 is at the H level is a period between time t8 and time t11' and a period between time t3 and time t7. Further, the predetermined period after the detection result d1 is at the H level is a period between time t1 and time t4' and a period between time t10 and time t14.

The description given with reference to FIG. 17A is based on the assumption that a counter pulse having a negative amplitude is detected (time t3 to time t5), and that a counter pulse having a positive amplitude is detected (time t10 to time t12). However, the counter pulse having a negative or positive amplitude may not be detected depending, for instance, on the settings of the threshold voltages Vth+, Vth− and on the operating conditions (temperature and power supply voltage). Even in such a case, it is natural that the receiver Rx3 can accurately receive data.

Figure 17B:
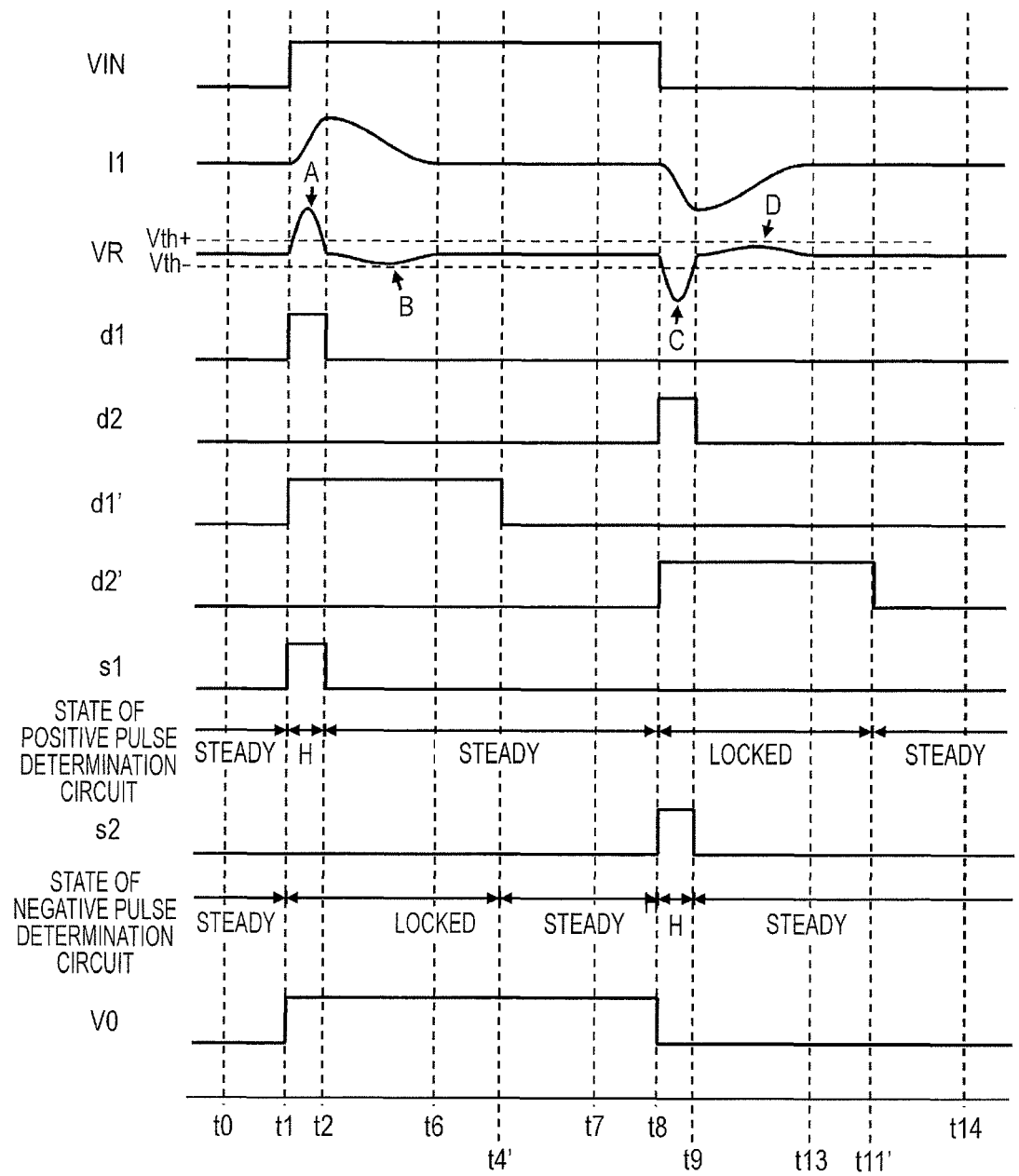
FIG. 17B is a timing diagram illustrating an operation of the receiver according to the third embodiment.

FIG. 17B is a timing diagram illustrating another operation of the receiver Rx3. The timing diagram of FIG. 17B differs from the timing diagram of FIG. 17A in that no counter pulse is detected. FIG. 17B also indicates that the receiver Rx3 receives (reproduces) data with high accuracy. The other operation depicted in the timing diagram of FIG. 17B will not be described because it is the same as depicted in FIG. 17A.

As described above, the receiver Rx3 according to the present embodiment does not determine any pulse signal as a normal pulse signal until a predetermined period of time elapses after a pulse signal having a positive or negative amplitude is detected and determined as a normal pulse signal. Hence, the receiver Rx3 according to the present embodiment provides advantages equivalent to those provided by the first and second embodiments.

As described earlier, after a pulse signal having a positive or negative amplitude is detected and determined as a normal pulse signal, the receiver according to the first or second embodiment does not determine any pulse signal as a normal pulse signal until neither a pulse signal having a positive amplitude nor a pulse signal having a negative amplitude is detected. Hence, the receiver according to the first or second embodiment can eliminate noise components (including a counter pulse) generated in the reception signal VR. This makes it possible to receive (reproduce) data with high accuracy. In this instance, the receiver according to the first or second embodiment does not have a dedicated circuit for analog voltage comparison unlike related arts and exercises digital control with a positive pulse determination circuit and with a negative pulse determination circuit. Therefore, data can be accurately received by using a small-scale circuit configuration.

Further, even when noise components, including a counter pulse, are detected with a time lag after the detection of a normal pulse signal, the receiver according to the second embodiment can accurately receive data by delaying the fall of a detection result of the pulse detection circuit.

Moreover, the receiver according to the third embodiment does not determine any pulse signal as a normal pulse signal until a predetermined period of time elapses after a pulse signal having a positive or negative amplitude is detected and determined as a normal pulse signal. Consequently, the receiver according to the third embodiment provides advantages equivalent to those provided by the first and second embodiments.

(Alternative Implementations of Semiconductor Integrated Circuits 1 to 3)

Figure 24:
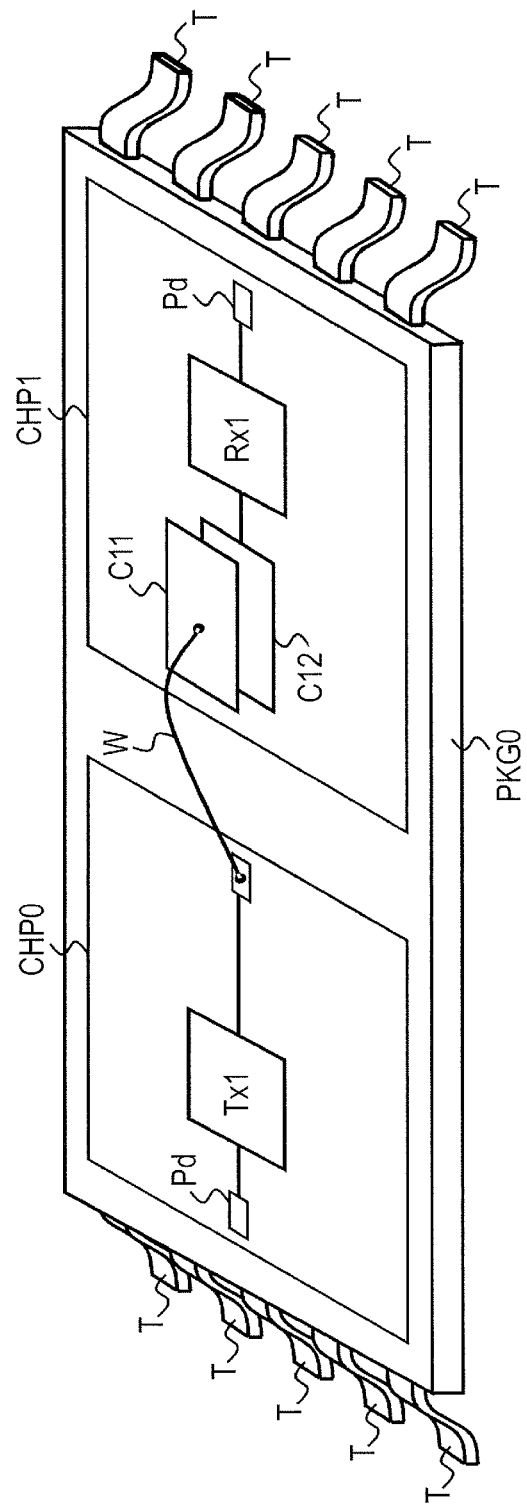
FIG. 24 is a schematic diagram illustrating how the semiconductor integrated circuit according to the first to third embodiments is implemented.
Figure 25:
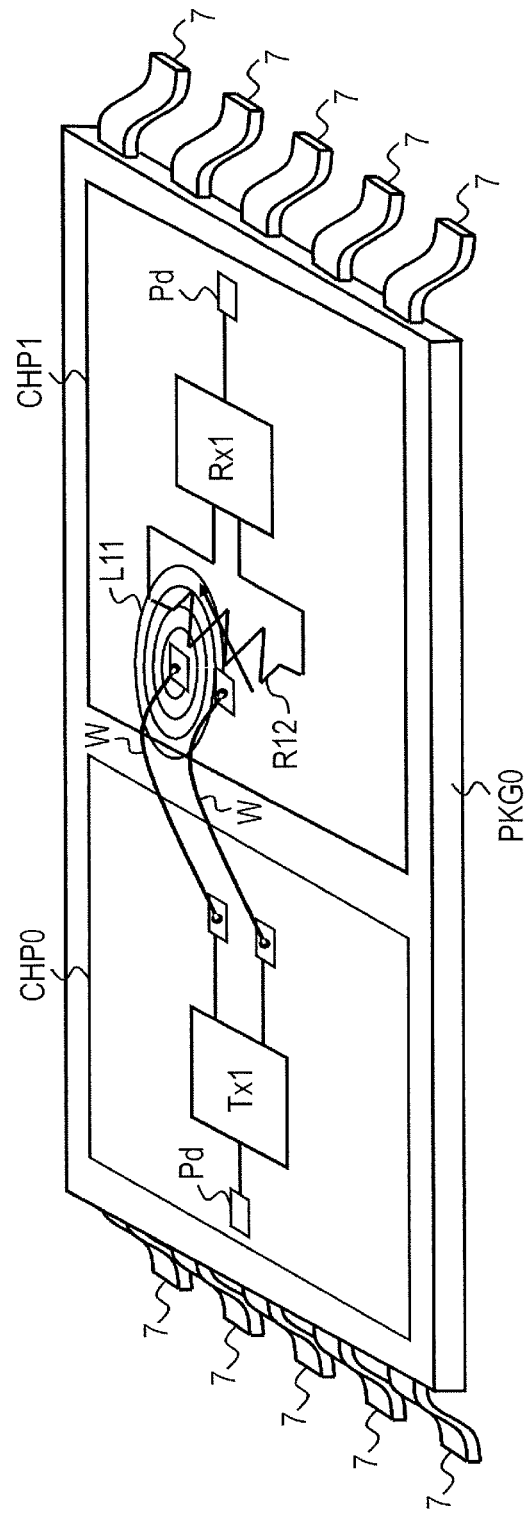
FIG. 25 is a schematic diagram illustrating how the semiconductor integrated circuit according to the first to third embodiments is implemented.

The implementation of the semiconductor integrated circuit 1 to 3 is not limited to the one depicted in FIG. 2. The semiconductor integrated circuit 1 will now be used as a representative example to describe alternative implementations of the semiconductor integrated circuits 1 to 3 with reference to FIGS. 18 to 25. FIGS. 18 to 23 show alternative implementations in which a transformer is used as the AC-coupling element ISO1. FIG. 24 shows an alternative implementation in which a capacitor is used as the AC-coupling element ISO1. FIG. 25 shows an alternative implementation in which a GMR element is used as the AC-coupling element ISO1.

Figure 18:
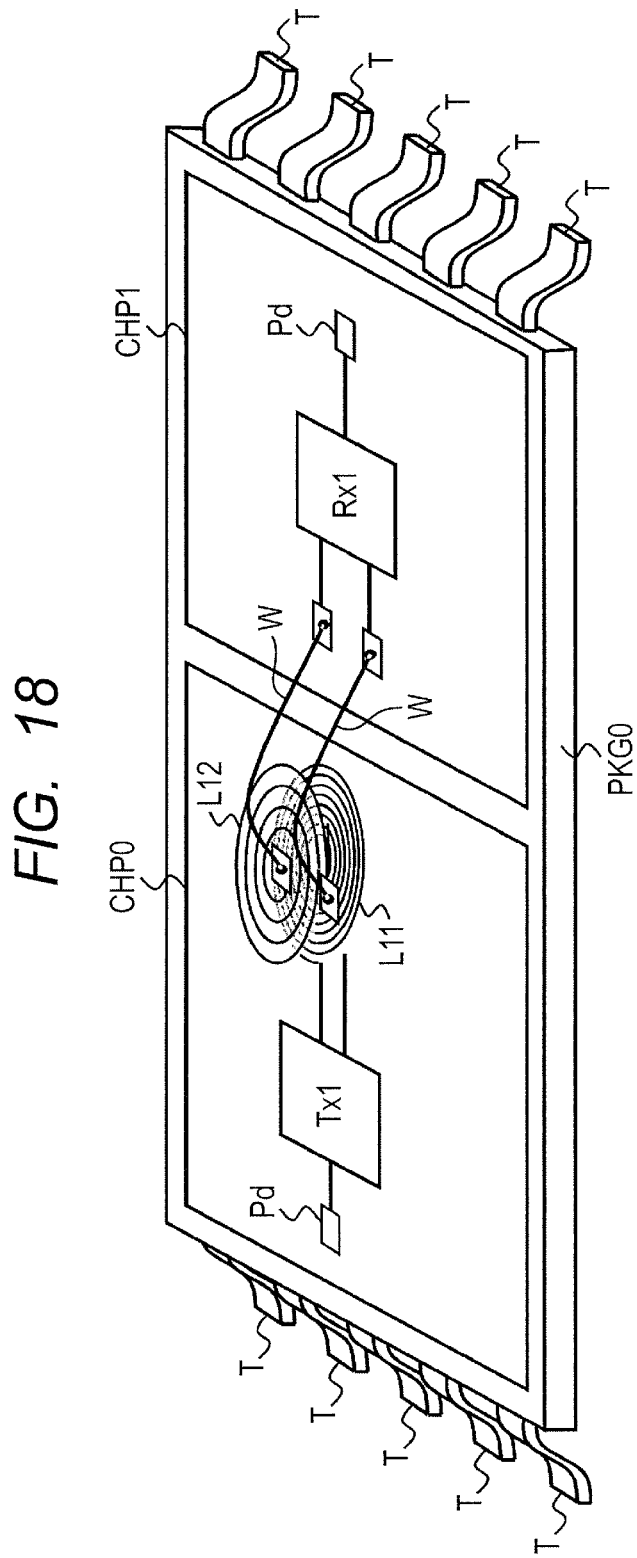
FIG. 18 is a schematic diagram illustrating how the semiconductor integrated circuit according to the first to third embodiments is implemented.

In the implementation shown in FIG. 18, the transmitter Tx1 and the primary and secondary coils L11, L12, which configure the AC-coupling element ISO1, are formed over the semiconductor chip CHP0, and the receiver Rx1 is formed over the semiconductor chip CHP1. Further, the pad to be coupled to both ends of the secondary coil L12 is formed over the semiconductor chip CHP0. Furthermore, the pad to be coupled to the input of the receiver Rx1 is formed over the semiconductor chip CHP1. The receiver Rx1 is coupled through these pads and bonding wires W to the secondary coil L12 formed over the semiconductor chip CHP0.

In the implementation shown in FIG. 18, the primary coil L11 and the secondary coil L12 are respectively formed in the first wiring layer and in the second wiring layer, which are vertically stacked in a single semiconductor chip.

Figure 19:
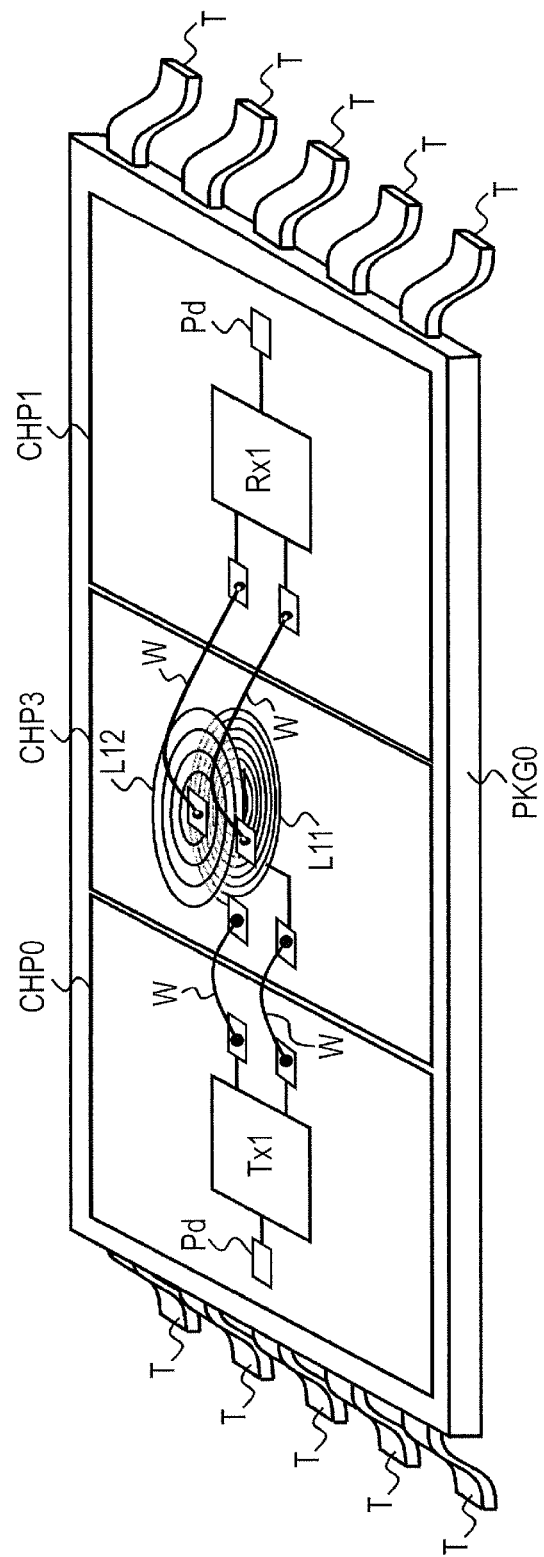
FIG. 19 is a schematic diagram illustrating how the semiconductor integrated circuit according to the first to third embodiments is implemented.

In the implementation shown in FIG. 19, the transmitter Tx1 is formed over the semiconductor chip CHP0, the receiver Rx1 is formed over the semiconductor chip CHP1, and the primary and secondary coils L11, L12, which configure the AC-coupling element ISO1, are formed over a semiconductor chip CHP3, which differs from the semiconductor chips CHP0, CHP1. Further, the pad to be coupled to the output of the transmitter Tx1 is formed over the semiconductor chip CHP0. The pad to be coupled to the input of the receiver Rx1 is formed over the semiconductor chip CHP1. Further, the pads to be coupled to both ends of the primary coil L11 and the pads to be coupled to both ends of the secondary coil L12 are formed over the semiconductor chip CHP3. The transmitter Tx1 is coupled through these pads and bonding wires W to the primary coil L11 formed over the semiconductor chip CHP3. The receiver Rx1 is coupled through these pads and bonding wires W to the secondary coil L12 formed over the semiconductor chip CHP3.

In the implementation shown in FIG. 19, the primary coil L11 and the secondary coil L12 are respectively formed in the first wiring layer and in the second wiring layer, which are vertically stacked in a single semiconductor chip.

Figure 20:
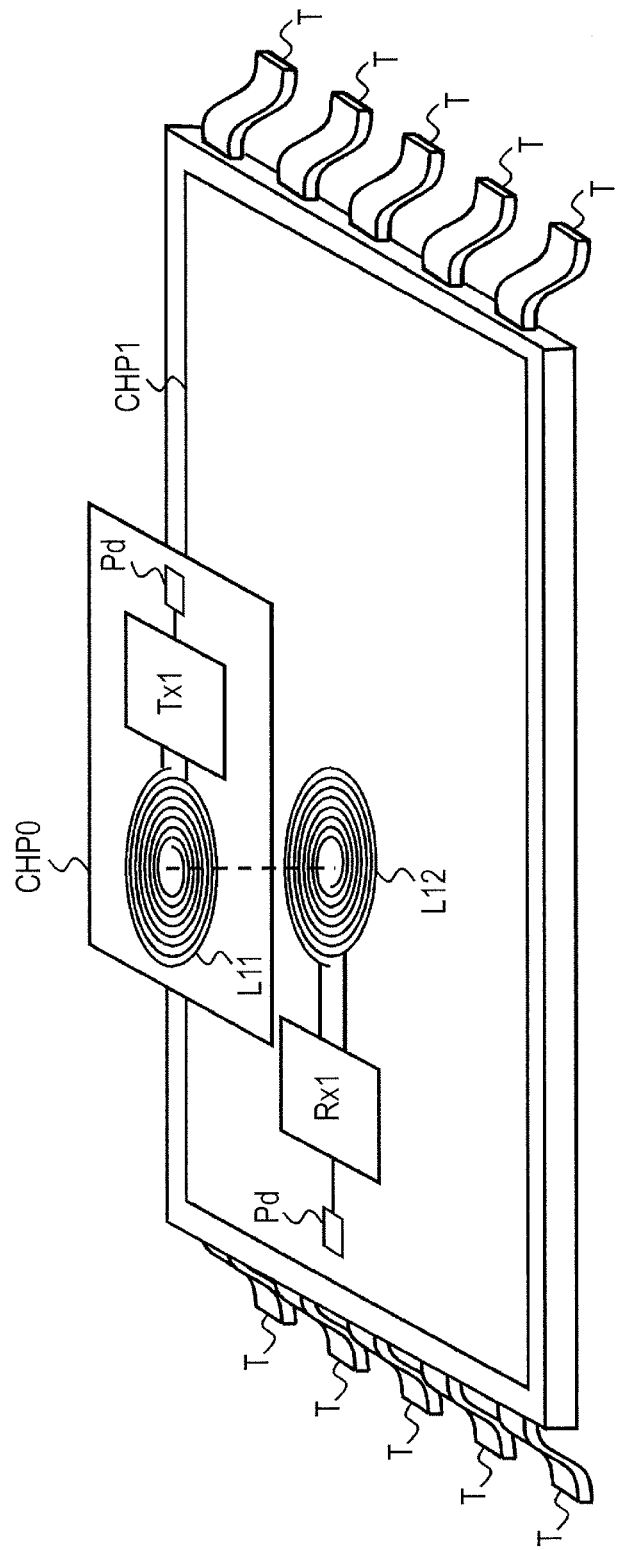
FIG. 20 is a schematic diagram illustrating how the semiconductor integrated circuit according to the first to third embodiments is implemented.

In the implementation shown in FIG. 20, the transmitter Tx1 and the primary coil L11 are formed over the semiconductor chip CHP0, the receiver Rx1 and the secondary coil L12 are formed over the semiconductor chip CHP1, and the semiconductor chip CHP0 and the semiconductor chip CHP1 are stacked. Further, the center of the primary coil L11 is in alignment with the center of the secondary coil L12 while the semiconductor chip CHP0 and the semiconductor chip CHP1 are stacked.

Figure 21:
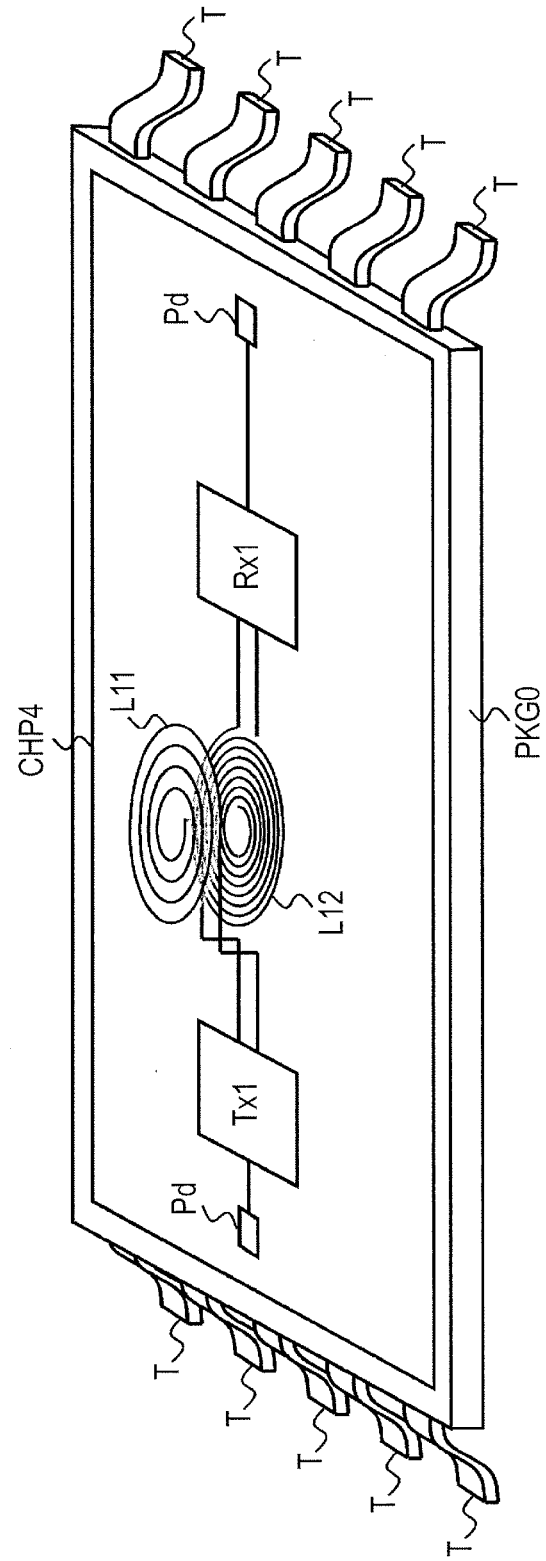
FIG. 21 is a schematic diagram illustrating how the semiconductor integrated circuit according to the first to third embodiments is implemented.

In the implementation shown in FIG. 21, the transmitter Tx1, the receiver Rx1, and the primary and secondary coils L11, L12, which configure the AC-coupling element ISO1, are formed over a common semiconductor chip CHP4. In the example shown in FIG. 21, the primary coil L11 and the secondary coil L12 are respectively formed in the first wiring layer and in the second wiring layer, which are vertically stacked over the semiconductor chip CHP4. Further, a region where the transmitter Tx1 is disposed and a region where the receiver Rx1 is disposed are insulated from each other by an insulating layer formed in a substrate of the semiconductor chip CHP4.

Figure 22:
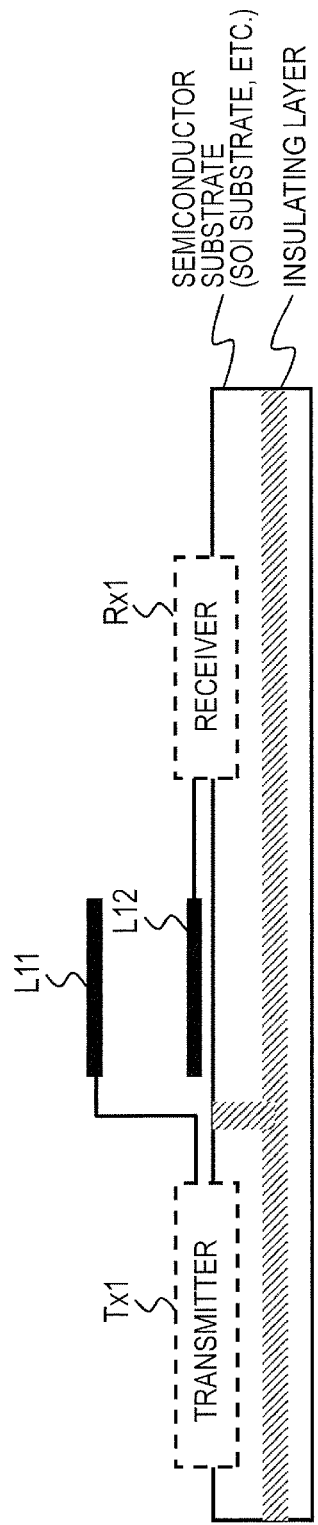
FIG. 22 is a schematic diagram illustrating how the semiconductor integrated circuit according to the first to third embodiments is implemented.
Figure 23:
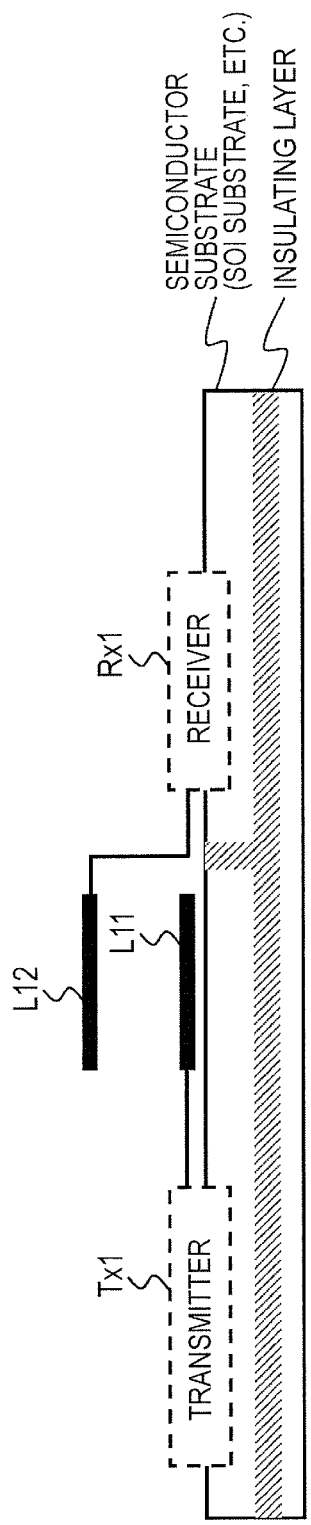
FIG. 23 is a schematic diagram illustrating how the semiconductor integrated circuit according to the first to third embodiments is implemented.

FIGS. 22 and 23 are cross-sectional views illustrating the substrate of the semiconductor chip CHP4 shown in FIG. 21. In the example shown in FIG. 22, a region where the transmitter Tx1 is formed and a region where the receiver Rx1 is formed are electrically isolated from each other by an insulating layer. The primary coil L11 and the secondary coil L12 are disposed in the region where the receiver Rx1 is formed. Meanwhile, in the example shown in FIG. 23, the region where the transmitter Tx1 is formed and the region where the receiver Rx1 is formed are electrically isolated from each other by an insulating layer. The primary coil L11 and the secondary coil L12 are disposed in the region where the transmitter Tx1 is formed.

FIG. 24 shows a case where the transformer used as the AC-coupling element ISO1 in the implementation shown in FIG. 2 is replaced by a capacitor. More specifically, FIG. 24 shows a case where the coil L11 is replaced by one electrode C11 of the capacitor and the coil L12 is replaced by the other electrode C12 of the capacitor.

FIG. 25 shows a case where the transformer used as the AC-coupling element ISO1 in the implementation shown in FIG. 2 is replaced by a GMR element. More specifically, FIG. 25 shows a case where the coil L11 is used as it is and the coil L12 is replaced by a GMR element R12.

As mentioned earlier, the type and disposition of the AC-coupling element ISO1 are not specifically limited. Although the above description is given on the assumption that the AC-coupling element ISO1 is formed over a semiconductor chip, the AC-coupling element ISO1 may be disposed as an external part.

(Examples of Application to Products)

The semiconductor integrated circuit according to the first, second, or third embodiment controls, for example, a power transistor. In this instance, the semiconductor integrated circuit according to the first, second, or third embodiment controls the conduction between a power supply and a load by exercising on-off control of the power transistor in accordance with the data VO reproduced by the receiver.

Further, the semiconductor integrated circuit according to the first, second, or third embodiment is applicable to an inverter that drives a motor (load) as shown, for instance, in FIG. 26. The high and low sides of the inverter shown in FIG. 26 each have three gate drivers to exercise analog control of a current (e.g., IU) flowing to the motor in accordance with PWM-modulated transmission data (e.g., UH, UL) output from a microcomputer (see FIG. 27).

(Comparison with Related Arts)

The semiconductor integrated circuit disclosed in "A 2.5 kV isolation 35 kV/us CMR 250 Mbps 0.13 mA/Mbps digital isolator in standard CMOS with an on-chip small transformer" (S. Kaeriyama, S. Uchida, M. Furumiya, M. Okada, M. Mizuno, 2010 Symposium on VLSI Circuits, Technical Digest of Technical Papers, 2010, pp. 197-198) compares the amplitude of a pulse signal having a positive amplitude to the amplitude of a pulse signal having a negative amplitude to determine which pulse signal is a normal pulse signal indicative of a data transition. However, this related art semiconductor integrated circuit cannot suppress an increase in circuit size because it requires a dedicated circuit (particularly, a passive element) for analog voltage comparison. In addition, this related art semiconductor integrated circuit cannot be designed with ease due, for instance, to the difficulty in adjusting its characteristics. The dedicated circuit for analog voltage comparison is, for example, a reference voltage generator circuit, a resistive element, a capacitive element, or a peak hold circuit. On the other hand, the receiver according to the first, second, or third embodiment can readily suppress an increase in circuit size unlike the related art because it digitally determines a normal pulse signal. Further, the receiver according to the first, second, or third embodiment can be designed with relative ease because it provides digital control.

Moreover, the related art semiconductor integrated circuit requires that the amplitude of a counter pulse be sufficiently smaller than the amplitude of a normal pulse signal. This makes it necessary to fine-tune a current flowing to a transmission coil. On the other hand, the receiver according to the first, second, or third embodiment eliminates the counter pulse without regard to its amplitude. This obviates the necessity of fine-tuning the current flowing to the transmission coil.

While the present invention contemplated by its inventors has been described in detail in terms of preferred embodiments, it is to be understood that the present invention is not limited to those preferred embodiments, but extends to various modifications that nevertheless fall within the scope of the appended claims.

The first to third embodiments have been described on the assumption that the positive pulse determination circuit and the negative pulse determination circuit have the same circuit configuration. However, the present invention is not limited to such a configuration. The present invention is also applicable to a different configuration in which the positive pulse determination circuit and the negative pulse determination circuit have the same functions.

In the first to third embodiments, which have been described above, the positive pulse determination circuit outputs the L-level determination result s1 during the first period. If a pulse signal having a positive amplitude is detected during a period other than the first period, the positive pulse determination circuit outputs the H-level determination result s1. Further, the negative pulse determination circuit outputs the L-level determination result s2 during the second period. If a pulse signal having a negative amplitude is detected during a period other than the second period, the negative pulse determination circuit outputs the H-level determination result. However, the logic values of the determination results s1, s2 are provisionally determined. Therefore, either or both of the positive and negative pulse determination circuits may output determination results s1, s2 of an inverse logic value as far as they fall within the scope of the appended claims. In this case, the configuration of a downstream data generation section is modified as appropriate.

For example, the receiver according to the foregoing embodiments includes: a pulse detection circuit; a positive pulse determination circuit; a negative pulse determination circuit; and a data generation section. The pulse detection circuit detects a pulse signal having a positive amplitude and a pulse signal having a negative amplitude, which are transmitted from a transmitter through an AC-coupling element. The positive pulse determination circuit outputs a first determination result of a first logic value during a first period, which is an interval between the instant at which a pulse signal having a negative amplitude is detected and the instant at which neither a pulse signal having a positive amplitude nor a pulse signal having a negative amplitude is detected, and outputs the first determination result of a second logic value if a pulse signal having a positive amplitude is detected during a period other than the first period. The negative pulse determination circuit outputs a second determination result of one of the first and second logic values during a second period, which is an interval between the instant at which a pulse signal having a positive amplitude is detected and the instant at which neither a pulse signal having a positive amplitude nor a pulse signal having a negative amplitude is detected, and outputs the second determination result of the other one of the first and second logic values if a pulse signal having a negative amplitude is detected during a period other than the second period. The data generation section generates data in accordance with the first and second determination results. A detailed circuit configuration for implementing the above receiver is shown, for instance, in FIG. 5.

More specifically, the receiver according to the foregoing embodiments includes: a pulse detection circuit that detects a pulse signal having a positive amplitude and a pulse signal having a negative amplitude, which are transmitted from a transmitter through an AC-coupling element, and outputs the detected pulse signals as first and second detection results, respectively; a positive pulse determination circuit that outputs a first determination result; a negative pulse determination circuit that outputs a second determination result; and a data generation section that generates data in accordance with the first and second determination results. The positive pulse determination circuit includes: a first SR latch circuit that uses a set input terminal to input the second detection result, uses a reset input terminal to input an inverted signal of the first detection result, and uses an output terminal to output a first intermediate signal; and a first logical AND circuit that outputs the logical AND of the first detection result and an inverted signal of the first intermediate signal as the first determination result. The negative pulse determination circuit includes: a second SR latch circuit that uses a set input terminal to input the first detection result, uses a reset input terminal to input an inverted signal of the second detection result, and uses an output terminal to output a second intermediate signal; and a second logical AND circuit that outputs the logical AND of the second detection result and an inverted signal of the second intermediate signal as the second determination result.

Further, for example, the receiver according to the foregoing embodiments includes: a pulse detection circuit; a positive pulse determination circuit; a negative pulse determination circuit; and a data generation section. The pulse detection circuit detects a pulse signal having a positive amplitude and a pulse signal having a negative amplitude, which are transmitted from a transmitter through an AC-coupling element. The positive pulse determination circuit outputs a first determination result of a first logic value during a predetermined period after the detection of a pulse signal having a negative amplitude, and outputs the first determination result of a second logic value if a pulse signal having a positive amplitude is detected during a period other than the predetermined period. The negative pulse determination circuit outputs a second determination result of one of the first and second logic values during a predetermined period after the detection of a pulse signal having a positive amplitude, and outputs the second determination result of the other one of the first and second logic values if a pulse signal having a negative amplitude is detected during a period other than the predetermined period. The data generation section generates data in accordance with the first and second determination results. A detailed circuit configuration for implementing the above receiver is shown, for instance, in FIG. 15.

More specifically, the receiver according to the foregoing embodiments includes: a pulse detection circuit that detects a pulse signal having a positive amplitude and a pulse signal having a negative amplitude, which are transmitted from a transmitter through an AC-coupling element, and outputs the detected pulse signals as first and second detection results, respectively; a positive pulse determination circuit that outputs a first determination result; a negative pulse determination circuit that outputs a second determination result; and a data generation section that generates data in accordance with the first and second determination results. The positive pulse determination circuit includes: a first delay circuit; and a first logical AND circuit. The first delay circuit outputs, with a delay, a portion of the second detection result that indicates that a pulse signal having a negative amplitude has not been detected. The first logical AND circuit outputs the logical AND of the first detection result and an inverted signal of the second detection result delayed by the first delay circuit as the first determination result. The negative pulse determination circuit includes: a second delay circuit; and a second logical AND circuit. The second delay circuit outputs, with a delay, a portion of the first detection result that indicates that a pulse signal having a positive amplitude has not been detected. The second logical AND circuit outputs the logical AND of the second detection result and an inverted signal of the first detection result delayed by the second delay circuit as the second determination result.

What is claimed is:

1. A receiver comprising:
a pulse detection circuit that detects a pulse signal having a positive amplitude and a pulse signal having a negative amplitude, which are transmitted from a transmitter through an AC-coupling element;
a positive pulse determination circuit that outputs a first determination result of a first logic value during a first period, and outputs the first determination result of a second logic value if a pulse signal having a positive amplitude is detected during a period other than the first period, the first period being an interval between the instant at which a pulse signal having a negative amplitude is detected and the instant at which neither a pulse signal having a positive amplitude nor a pulse signal having a negative amplitude is detected;
a negative pulse determination circuit that outputs a second determination result of one of the first and second logic values during a second period, and outputs the second determination result of the other one of the first and second logic values if a pulse signal having a negative amplitude is detected during a period other than the second period, the second period being an interval between the instant at which a pulse signal having a positive amplitude is detected and the instant at which neither a pulse signal having a positive amplitude nor a pulse signal having a negative amplitude is detected; and
a data generation section that generates data in accordance with the first and second determination results.

2. The receiver according to claim 1, further comprising:
a delay circuit that outputs, with a delay, a portion of the detection result of the pulse detection circuit that indicates that a pulse signal having a positive amplitude has not been detected, and outputs, with a delay, a portion of the detection result of the pulse detection circuit that indicates that a pulse signal having a negative amplitude has not been detected;
wherein the positive and negative pulse determination circuits output the first and second determination results, respectively, in accordance with the detection result delayed by the delay circuit.

3. The receiver according to claim 1,
wherein the pulse detection circuit detects the pulse signal having a positive amplitude to output a first detection result and detects the pulse signal having a negative amplitude to output a second detection result;
wherein the positive pulse determination circuit includes:
a first SR latch circuit, which uses a set input terminal to input the second detection result, uses a reset input terminal to input an inverted signal of the first detection result, and uses an output terminal to output a first intermediate signal; and
a first logical AND circuit, which outputs the logical AND of the first detection result and an inverted signal of the first intermediate signal as the first determination result; and wherein the negative pulse determination circuit includes:
a second SR latch circuit, which uses a set input terminal to input the first detection result, uses a reset input terminal to input an inverted signal of the second detection result, and uses an output terminal to output a second intermediate signal; and
a second logical AND circuit, which outputs the logical AND of the second detection result and an inverted signal of the second intermediate signal as the second determination result.

4. The receiver according to claim 3, further comprising:
a delay circuit that outputs, with a delay, a portion of the first detection result that indicates that a pulse signal having a positive amplitude has not been detected, and outputs, with a delay, a portion of the second detection result that indicates that a pulse signal having a negative amplitude has not been detected,
wherein the positive and negative pulse determination circuits output the first and second determination results, respectively, in accordance with the first and second detection result delayed by the delay circuit.

5. The receiver according to claim 1, wherein the data generation section is an SR latch circuit that uses a set input terminal to input the first determination result, uses a reset input terminal to input the second determination result, and uses an output terminal to output the data.

6. A receiver comprising:
a pulse detection circuit that detects a pulse signal having a positive amplitude and a pulse signal having a negative amplitude, which are transmitted from a transmitter through an AC-coupling element;
a positive pulse determination circuit that outputs a first determination result of a first logic value during a predetermined period after the detection of a pulse signal having a negative amplitude, and outputs the first determination result of a second logic value if a pulse signal having a positive amplitude is detected during a period other than the predetermined period;
a negative pulse determination circuit that outputs a second determination result of one of the first and second logic values during a predetermined period after the detection of a pulse signal having a positive amplitude, and outputs the second determination result of the other one of the first and second logic values if a pulse signal having a negative amplitude is detected during a period other than the predetermined period; and
a data generation section that generates data in accordance with the first and second determination results.

7. The receiver according to claim 6,
wherein the pulse detection circuit detects the pulse signal having a positive amplitude to output a first detection result and detects the pulse signal having a negative amplitude to output a second detection result;
wherein the positive pulse determination circuit includes:
a first delay circuit, which outputs, with a delay, a portion of the second detection result that indicates that a pulse signal having a negative amplitude has not been detected; and
a first logical AND circuit, which outputs the logical AND of the first detection result and an inverted signal of the second detection result delayed by the first delay circuit as the first determination result, and
wherein the negative pulse determination circuit includes:
a second delay circuit, which outputs, with a delay, a portion of the first detection result that indicates that a pulse signal having a positive amplitude has not been detected; and
a second logical AND circuit, which outputs the logical AND of the second detection result and an inverted signal of the first detection result delayed by the second delay circuit as the second determination result.

8. The receiver according to claim 6, wherein the data generation section is an SR latch circuit that uses a set input terminal to input the first determination result, uses a reset input terminal to input the second determination result, and uses an output terminal to output the data.

9. A semiconductor integrated circuit comprising:
a transmitter that generates a pulse signal having a direction of amplitude corresponding to a direction of transition of data supplied from the outside and outputs the pulse signal as a transmission signal;
a receiver according to claim 1 that reproduces the data in accordance with a reception signal; and
an AC-coupling element that insulates the transmitter and the receiver from each other and transmits the transmission signal as the reception signal.

* * * * *

UNITED STATES PATENT AND TRADEMARK OFFICE
CERTIFICATE OF CORRECTION

PATENT NO. : 8,774,288 B2
APPLICATION NO. : 13/784262
DATED : July 8, 2014
INVENTOR(S) : Koichi Takeda et al.

It is certified that error appears in the above-identified patent and that said Letters Patent is hereby corrected as shown below:

On the title page item (56) should read:

References Cited
U.S. PATENT DOCUMENTS

| | | |
|---|---|---|
| 5,754,250 A | May 1998 | Cooper |
| 5,701,037 A | December 1997 | Weber et al. |
| 8,582,669 A | November 2013 | Chen, Jr. |
| 8,634,480 A | January 2014 | Nuebling et al. |
| 2003/0042571 A1 | March 2003 | Chen et al. |
| 2012/0007710 A1 | January 2012 | Tucci et al. |

FOREIGN PATENT DOCUMENTS

| | |
|---|---|
| JP-08-236696-A | Sep 1996 |
| JP-2011-142175-A | Jul 2011 |

OTHER PUBLICATIONS

Extended European Search Report issued in Application No. 13156891.7-1855 dated Jul. 24, 2013.

S. Kaeriyama, S. Uchida, M. Furumiya, M. Okada, M. Mizuno, "A 2.5kV isolation 35kV/us CMR 250Mbps 0.13mA/Mbps digital isolator in standard CMOS with an on-chip small transformer", 2010 Symposium on VLSI Circuits, Technical Digest of Technical Papers, 2010, pp197-198.

Signed and Sealed this
First Day of March, 2016

Michelle K. Lee
*Director of the United States Patent and Trademark Office*